United States Patent [19]

Haigh et al.

[11] Patent Number: 4,698,596
[45] Date of Patent: Oct. 6, 1987

[54] SWITCHED CAPACITOR SWITCHING

[75] Inventors: David G. Haigh, London; Bhajan Singh, Birmingham, both of England

[73] Assignee: The Secretary of State for Defence in Her Britannic Majesty's Government of the United Kingdom and Northern Ireland, London, England

[21] Appl. No.: 610,303
[22] PCT Filed: Aug. 12, 1983
[86] PCT No.: PCT/GB83/00203
§ 371 Date: May 7, 1984
§ 102(e) Date: May 7, 1984
[87] PCT Pub. No.: WO84/01065
PCT Pub. Date: Mar. 15, 1984

[30] Foreign Application Priority Data

Sep. 7, 1982 [GB] United Kingdom ............... 8225474

[51] Int. Cl.4 .................... G06G 7/18; H03K 5/00
[52] U.S. Cl. .................................... 328/127; 328/167
[58] Field of Search ............... 328/127, 167, 162; 333/19, 173, 172; 330/09, 107

[56] References Cited

U.S. PATENT DOCUMENTS 4,313,096  1/1982  Fleischer ........................... 333/173

OTHER PUBLICATIONS

Laker et al., "Parasitic Insensitive Bi-Phase Switched Cap. Filters" ISCS, pp. 435-439, May 1982.
Herbst et al., "Vis-SC-Filter with Reduced Influences of Parasitic Capacitances", IEE Proc., vol. 129, No. 2, Apr. 1982, pp. 29-39.
Martin et al., "Strays-Insensitive Switched-Capacitor Filters Based on Bilinear Z-Transform", Electronics Letters, 21 Jun. 79, vol. 15, No. 13, pp. 365-366.
Martin, "Improved Circuits for the Realization of Switch Cap. Filters", Proc. of 1979 IEEE International Symp. on Cict and Systems, pp. 756-759.
Article by J. Pandel entitled "Switched-Capacitor Elements for VIS-SC Filters" pp. 121-130.
Article by Ian A. Young in the IEEE Journal of Solid-State Circuits, vol. SC-15, No. 6, Dec. 1980, entitled "A Low-Power NMOS Transmit/Receive IC Filter for PCM Telephony" pp. 997-1005.
Article by R. Gregorian "Filtering Techniques with Switched-Capacitor Circuits" Microelectronics Journal vol. 11 (1980) Mar./Apr. No. 2 Luton pp. 13-21.

Primary Examiner—Stanley D. Miller
Assistant Examiner—Timothy P. Callahan
Attorney, Agent, or Firm—Cushman, Darby & Cushman

[57] ABSTRACT

A switched capacitor parasitic insensitive integrator comprises an operational amplifier (6), an integrating capacitor $C_2$, a switched capacitor C, and four switches, two of even phase E1, E2 and two of odd phase 01, 02. In order to minimize the effect of capacitances (42) associated with the switches a 4-phase switching waveform is used such that E2 opens before E1, 02 opens before 01, E1 is not closed when 01 is closed and E2 is not closed when 02 is closed. A clock circuit may be used to provide the appropriate 4-phase switching waveform with a separate phase signal to each switch or a 2-phase switching waveform may be used with one phase signal to the E switches and the other phase signal to the O switches and the two switches E2, 02 biassed relative to E1, 01 such that the required differences in switching times occur.

7 Claims, 37 Drawing Figures (a) NON-INVERTING (b) INVERTING (c) DIFFERENTIAL INPUT (d) MULTI-INPUT (a) WAVEFORMS A (b) B (c) C (d) D (e) E

SWITCHED CAPACITOR SWITCHING

BACKGROUND OF THE INVENTION

The present invention relates to switched capacitor circuits and particularly though not exclusively to active switched capacitor filters including switches, capacitors and amplifiers.

Active RC filters have the potential to be constructed using integrated circuit technology. The time constants or RC products of these circuits however must be accurately defined, implying that the absolute values of resistance and capacitance should be closely controllable. This is not possible however. Switched capacitor circuits offer a solution to this difficulty since the transfer function of these circuits is a function of the ratio of circuit capacitors and the frequency of the switch clock. Capacitor ratios can be held to about 0.3% accuracy and precise switching frequencies can be obtained from crystal controlled clocks. Thus the switched capacitor circuit offers a realistic solution to the problem of designing a high precision filter which can be manufactured as a monolithic integrated circuit.

It is generally recognized that, in intergrated circuits, parasitic capacitances are present associated with the desired circuit elements and, due to the low values of capacitors permitted on an integrated circuit (design features as small as 1 micron are possible with VLSI using MOS), these parasitic capacitances cause unacceptable deviations in filter response. This has led to the design of so-called "parasitic insensitive" switched capacitor circuits wherein the circuit structures are constrained such that the addition of stray or parasitic capacitance from any node in the circuit to ground does not affect the circuit response. Integrator circuits and higher order filters consisting of interconnections of such integrators have been made "parasitic insensitive" and this has led to the development of high quality integrated filters.

The immunity to the effect of parasitic capacitances obtained by the use of parasitic insensitive circuits, however, includes only capacitances which are grounded and therefore does not extend to the parasitic capacitances associated with the control terminals of the switch elements. The inventors have analyzed the effects of these capacitances and have shown that they can be the cause of a major deterioration of circuit performance by introducing DC offset voltage, modification of the transfer function and distortion. Furthermore the inventors have shown that when switched capacitor circuits are operated using the 2-phase switching waveforms normally adopted for parasitic insensitive circuits there is a further disadvantage in that the degredation characteristics mentioned above are unpredictable since they are critically dependent on the relative opening times of nominally identical switches fed with nominally identical control signals.

SUMMARY OF THE INVENTION

The object of the present invention is to provide an improved integrator for use in switched capacitor circuits.

The invention modifies the switching waveforms applied to switched capacitor circuits including parasitic insensitive integrators of the kind defined by comprising:

an amplifier having inter-connected between an input and an output thereof an integrating capacitor;
the amplifier input being connected to ground via a first even phase switch (E2) and a first odd phase switch (O2);
the interconnection between E2 and the O2 phase switches being connected to one pole of at least one switched capacitor; and the opposed pole of the at least one switched capacitor being connected to the interconnection between a second even phase switch (E1) and a second odd phase switch (O1).

Conventionally 2-phase non-overlapping clock switching signals are applied to the four switches with the even switches being switched simultaneously and the odd switches also being switched simultaneously, the arrangement being such that the even switches are open during the odd phase of the switching signal and the odd switches are open during the even phase of the switching signal, and the reference voltage level is ground.

According to the present invention a parasitic insensitive circuit comprises: a parasitic insensitive integrator as defined above, and a clock circuit for producing periodic switching signals, each switching signal having the same period,
the phase signals being connected to the four switches and the signals being arranged such that E2 opens before E1,O2 opens before O1,E1 is not closed when O1 is closed and E2 is not closed when O2 is closed.

In one arrangement with the reference voltage being ground a 4-phase switching system is used, the clock circuit producing four periodic switching signals connected respectively to the four switches.

In an alternative arrangement a 2-phase switching system may be used, the clock producing two periodic switching signals with one signal connected to the E switches and the other signal connected to the O switches, the reference voltage being selected relative to ground such that the switching times of E2 differ from E1 and O2 differ from O1. 2-phase switching may also be used with the reference voltage ground and the switches made such that the switching times of E2 and O2 differ respectively from E1 and O1. By the above means, a conventional 2-phase clock arrangement produces an effective 4-phase switching.

Under these switching conditions the parasitic capacitances associated with the control terminals of the switches O1 and E1 have minimal effect upon the input offset voltage, defined as the difference in input voltages necessary to cause the output voltage of the integrator to remain unaltered after one switching cycle. The performance degradation of a parasitic insensitive integrator can be shown to depend upon the relative switching times of the E switches and also of the O switches. Thus in any circuit employing conventional 2-phase switching E2 may open before or after E1 and similarly O2 may open before or after O1 depending for example on circuit fabrication. The present invention overcomes this unpredictable degradation and in theory could eliminate and in practice significantly reduce the degradation effects of parasitic capacitances associated with the control terminals of the switches.

Preferably matched transistors and conductor routing are used for the E2 and O2 switches such that the parasitic capacitances between the source and control terminals of the switches are substantially equal.

If it is arranged that E2 closes before E1 then exact cancellation of the input offset voltages due to the control terminal parasitic capacitances can be achieved for exact matching of the switches and conductor routing. Alternatively, if the capacitance of the switched capacitor is much greater than the parasitic capacitance between the source and control terminals of the E2 switch then the input offset voltages due to the effects of control terminal parasitic capacitances are substantially cancelled.

An improvement to the linearity of circuits according to the invention may be obtained by arranging the switching such that E1 closes before E2 closes. A further improvement may be achieved by arranging that O1 switches closed before O2 switches closed.

There are four general types of parasitic integrator which can be derived from the integrator as hereinbefore defined and each can be operated using the 2-phase or 4-phase switching signals according to the invention:

(a) Connecting a first signal to the input of the switch E1 and a second signal to the input of the switch O1 defines a differential input integrator;

(b) Grounding the input of the switch E1 and connecting an input signal to the input of the switch O1 defines a non-inverting integrator;

(c) Grounding the input of the switch O1 and connecting an input signal to the input of the switch E1 defines an inverting integrator; and (d) Having two switched capacitors each connected to an E1 and an O1 switch defines a multi-input integrator having two inverting inputs associated with the E1 switches and two non-inverting inputs associated with the O1 switches.

A clock circuit for producing 4-phase switching signals for operating the four switches, E1, E2, O1 and O2, in a parasitic insensitive integrator comprises: a signal generator, for producing a reference frequency, a multi-stage counter circuit having an input to which the reference frequency is connected, a combining circuit having inputs from two separate stages of the counter to produce a standard switching waveform with a selected mark to space ratio, first and second shift registers having inputs connected to the output of the combining circuit, the shift registers having two outputs from separate stages thereof such that the second outputs provides the switching signals for the E switches delayed relative to the switching signals for the O switches provided by the first outputs, the first shift register being clocked by the positive phase of the reference frequency and the second shift register being clocked by the negative phase of the reference frequency whereby the first shift register provides the E2 and the O2 switching signals and the second shift register provides the E1 and the O1 switching signals with E1 and O1 delayed respectively relative to E2 and O2.

DETAILED DESCRIPTION OF THE INVENTION

The invention will now be described by way of example only with reference to the accompanying drawings of which:

FIGS. 9a–9e show various switching waveforms applied to the filter of FIG. 8;

Figure 11:
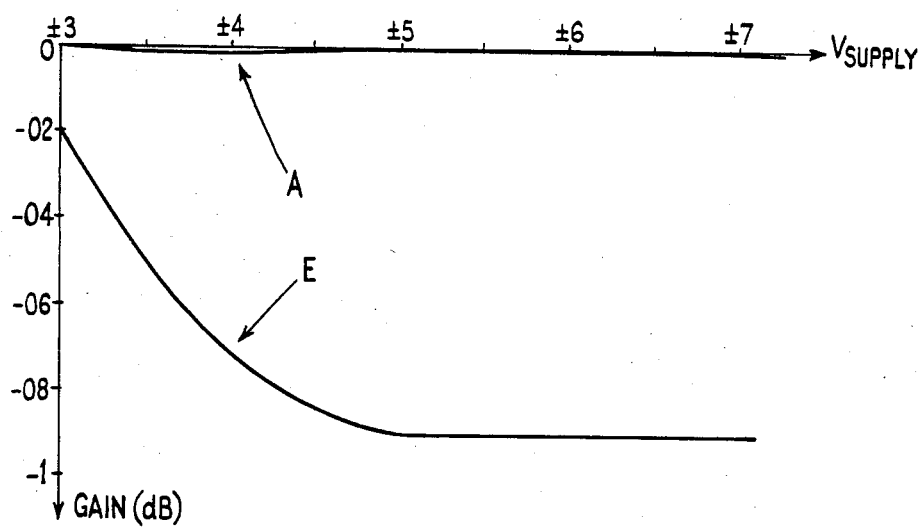
Figure 12:
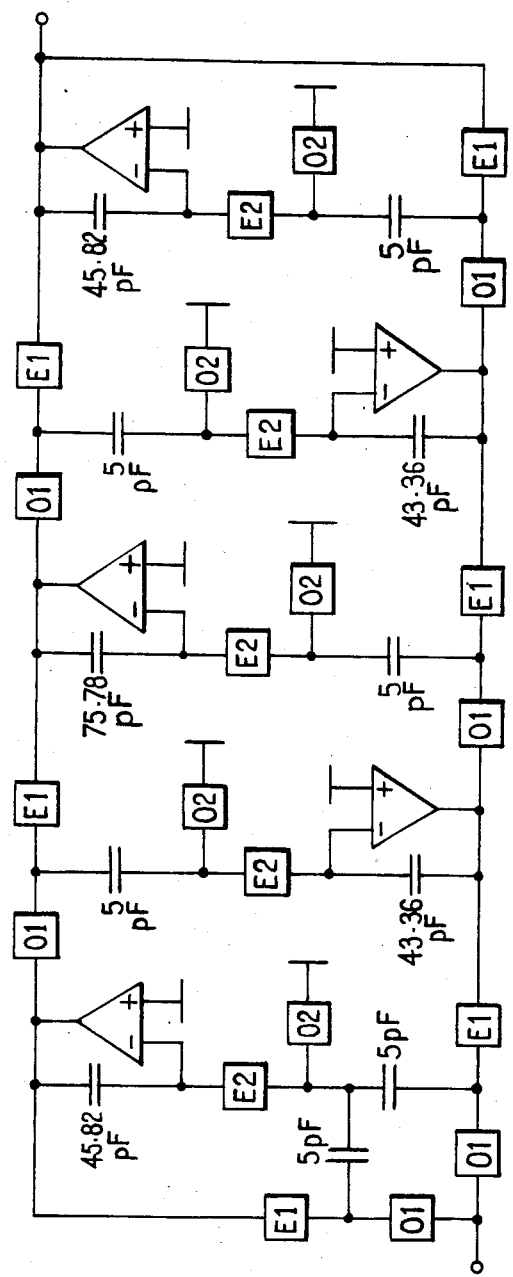
Figure 13:
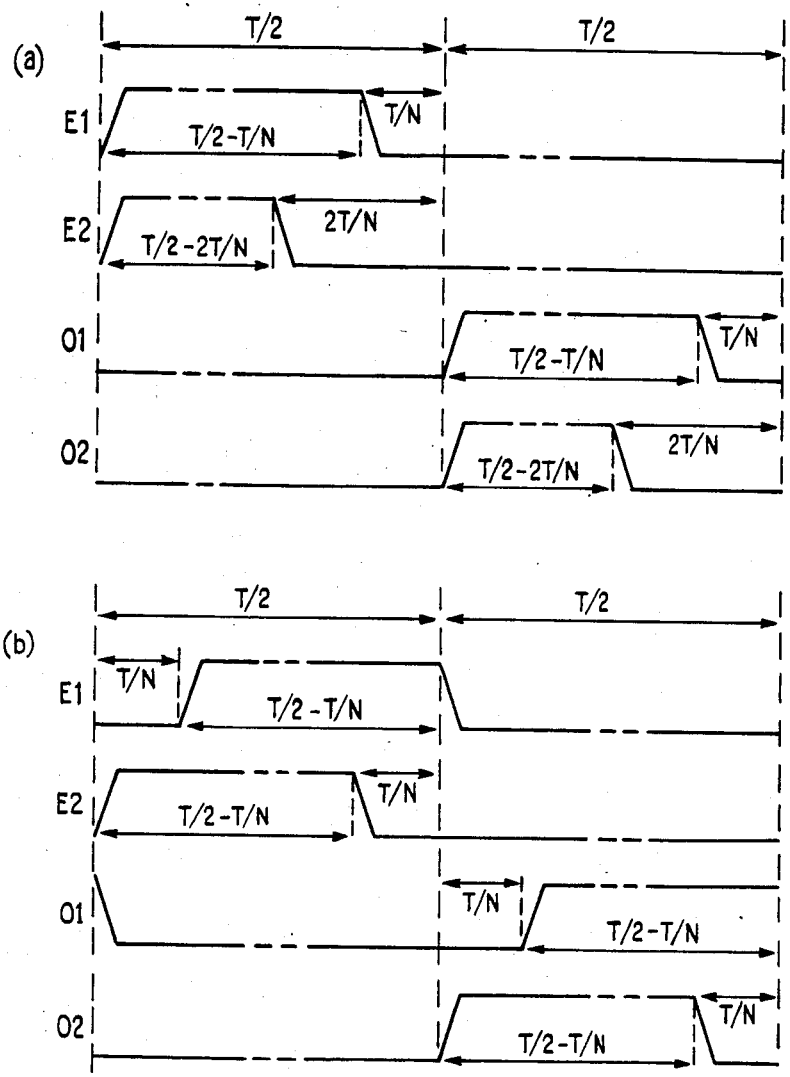
Figure 14:
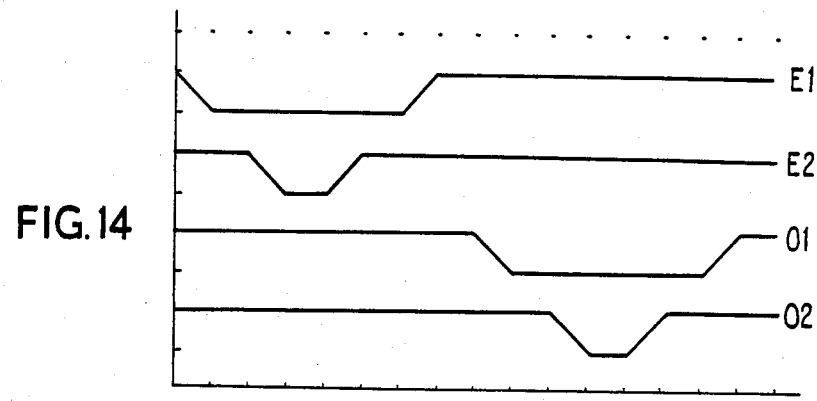
Figure 15:
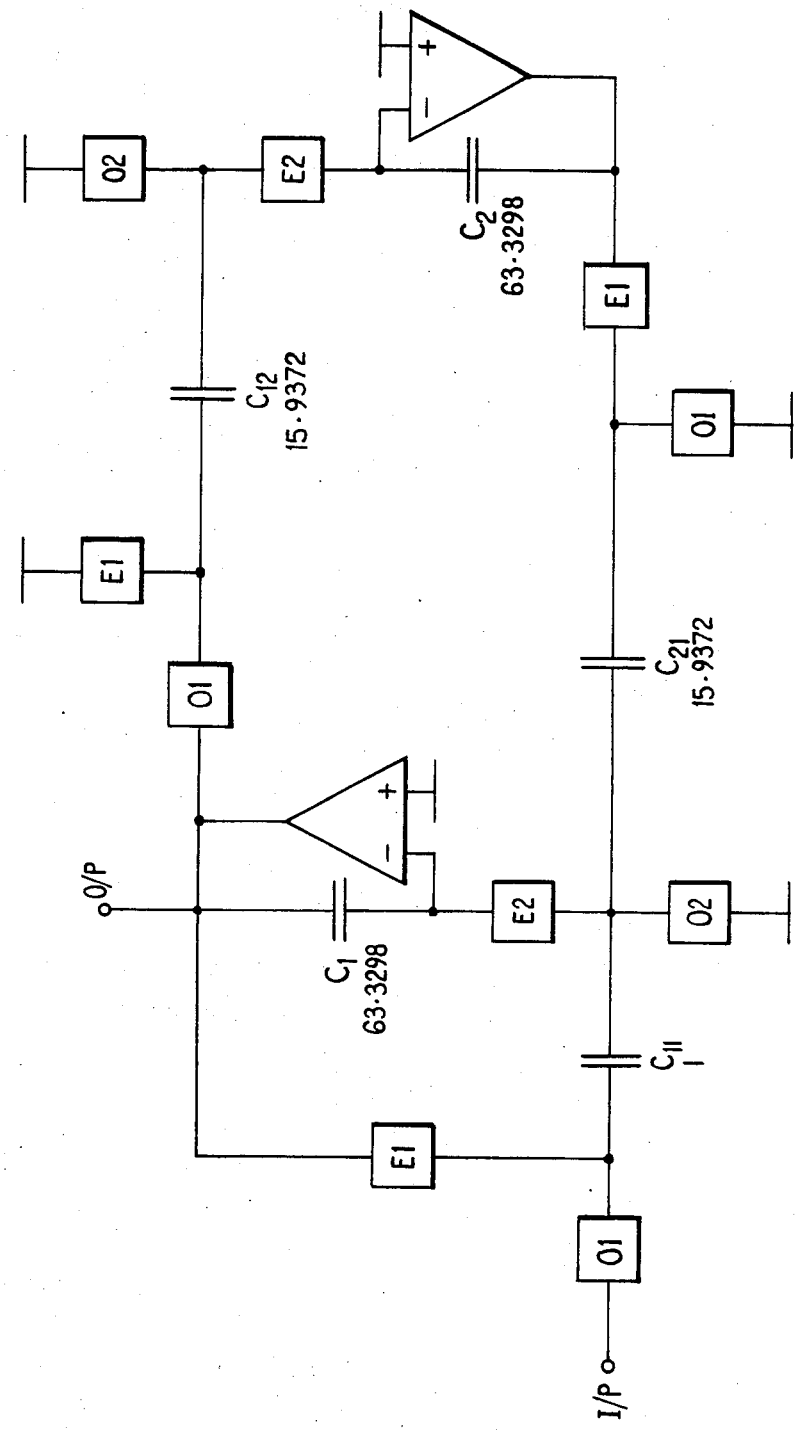
Figure 16A:
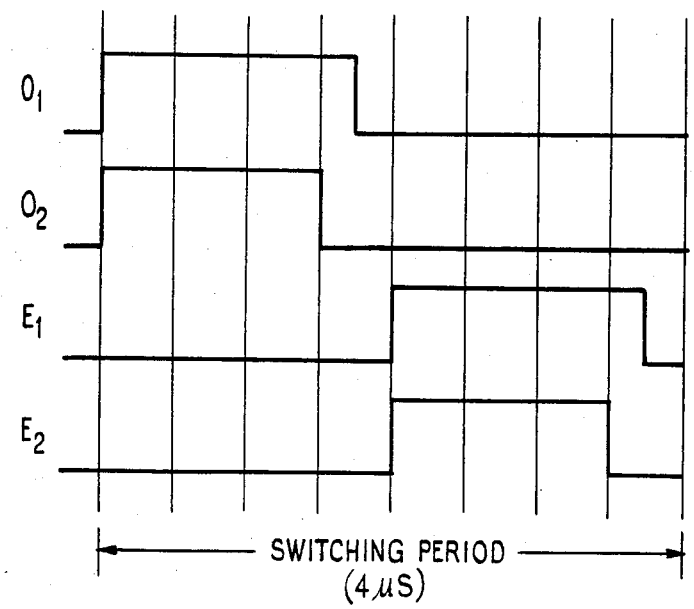
Figure 16B:
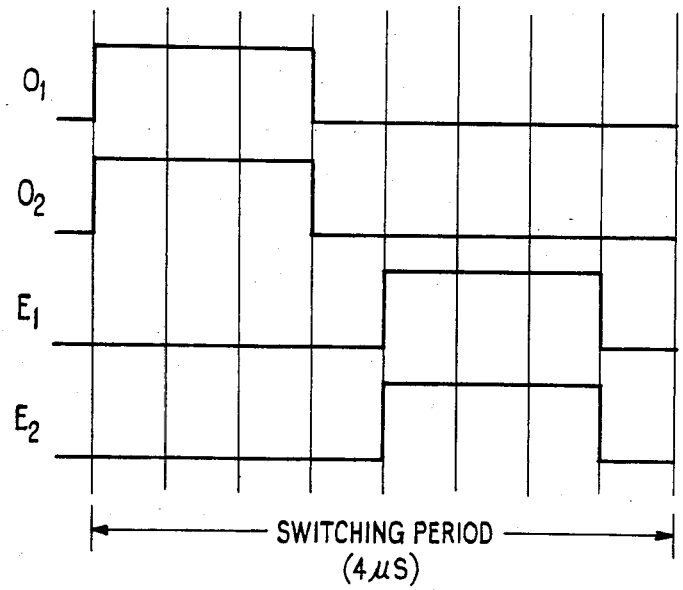
Figure 17:
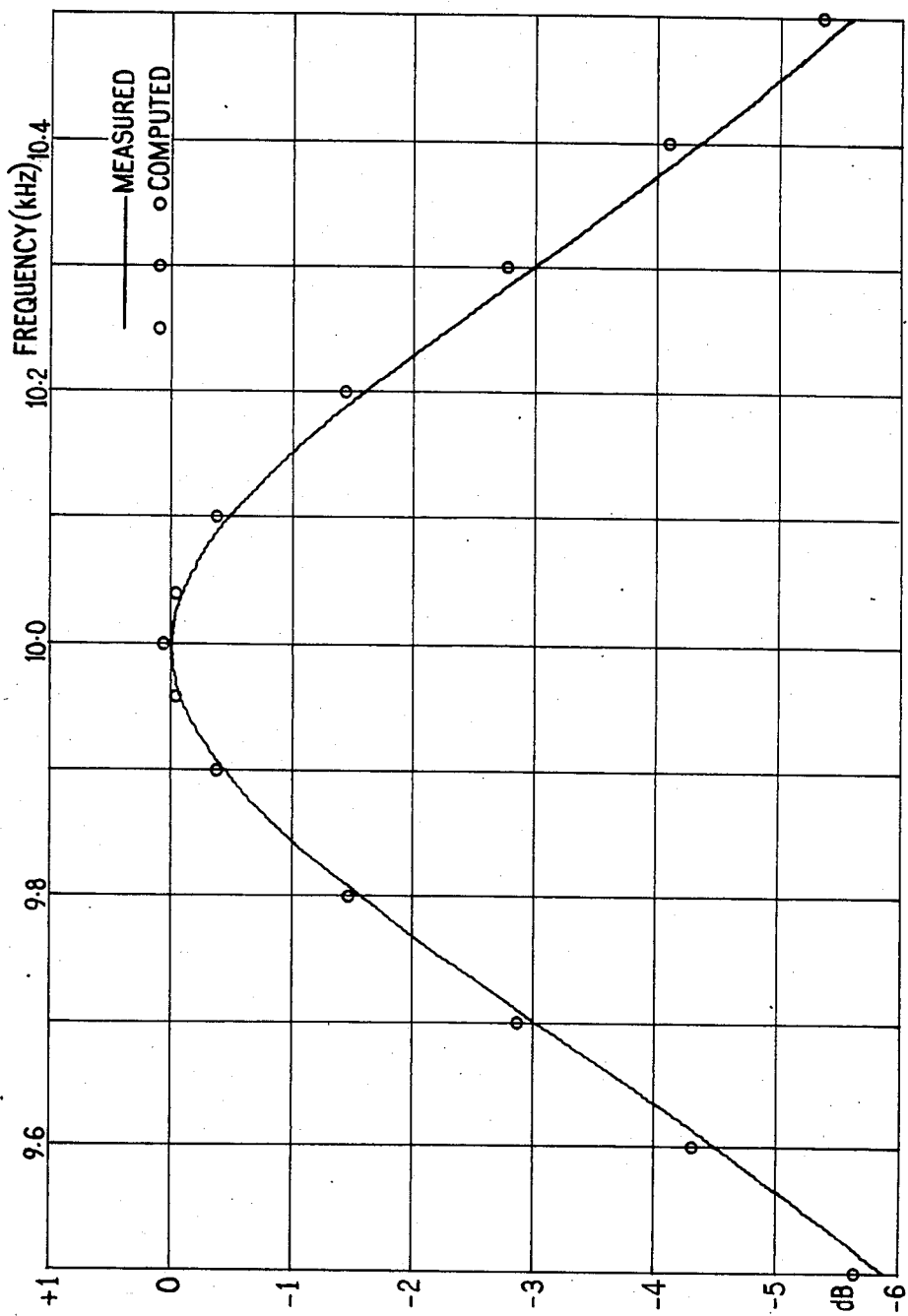
Figure 18:
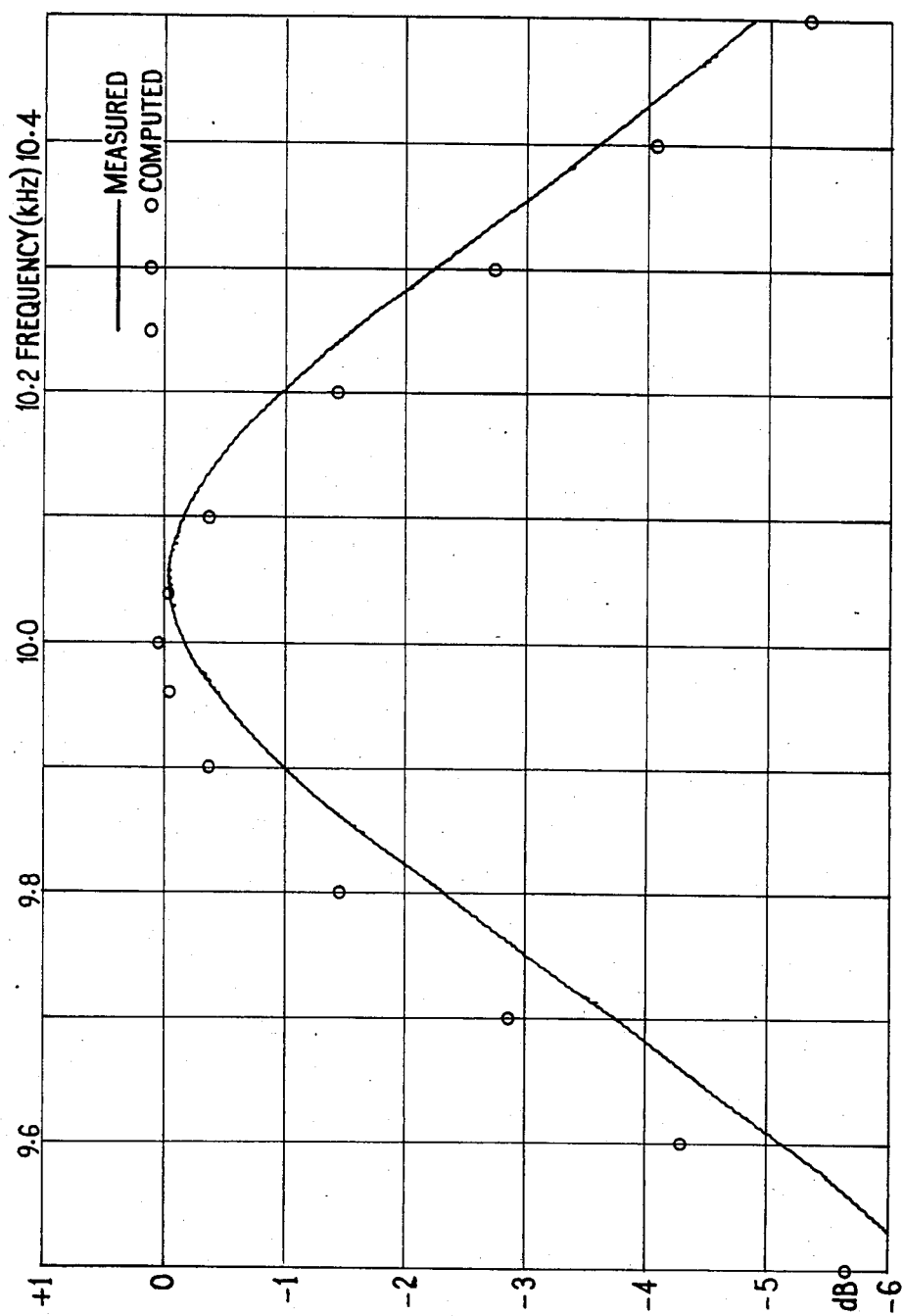
Figure 19:
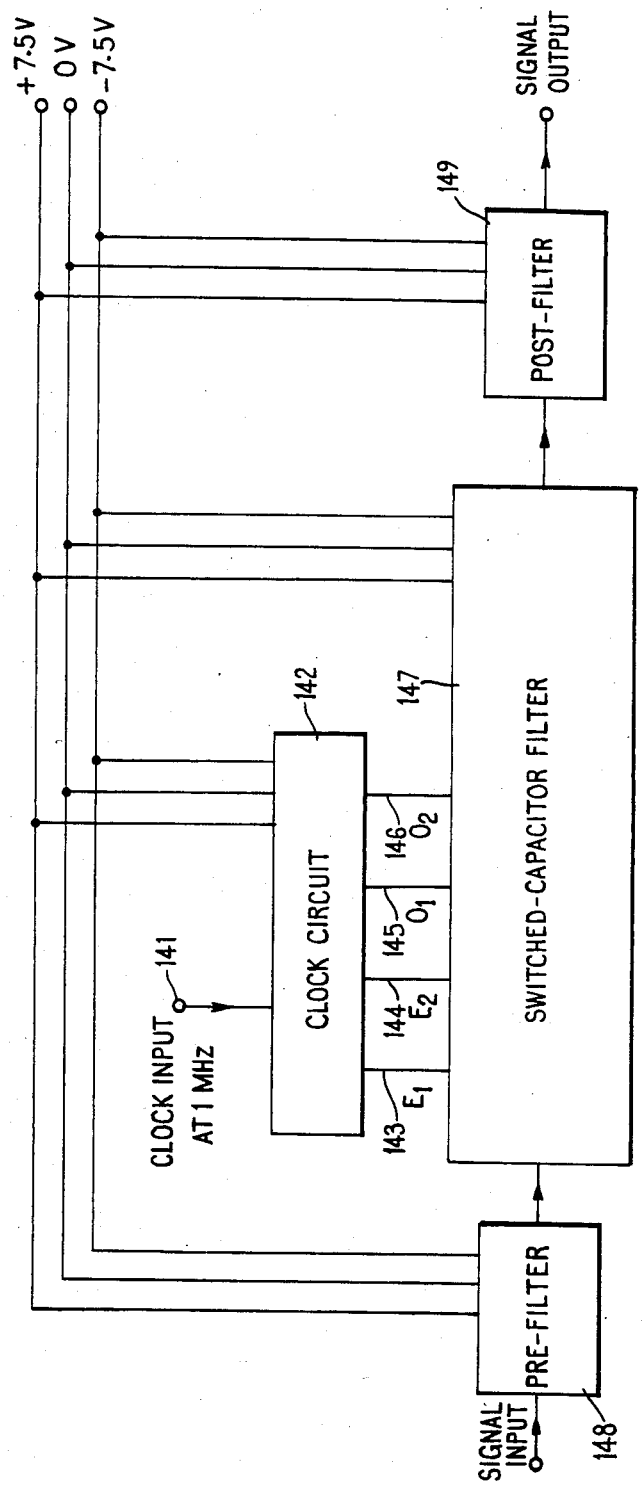
Figure 20:
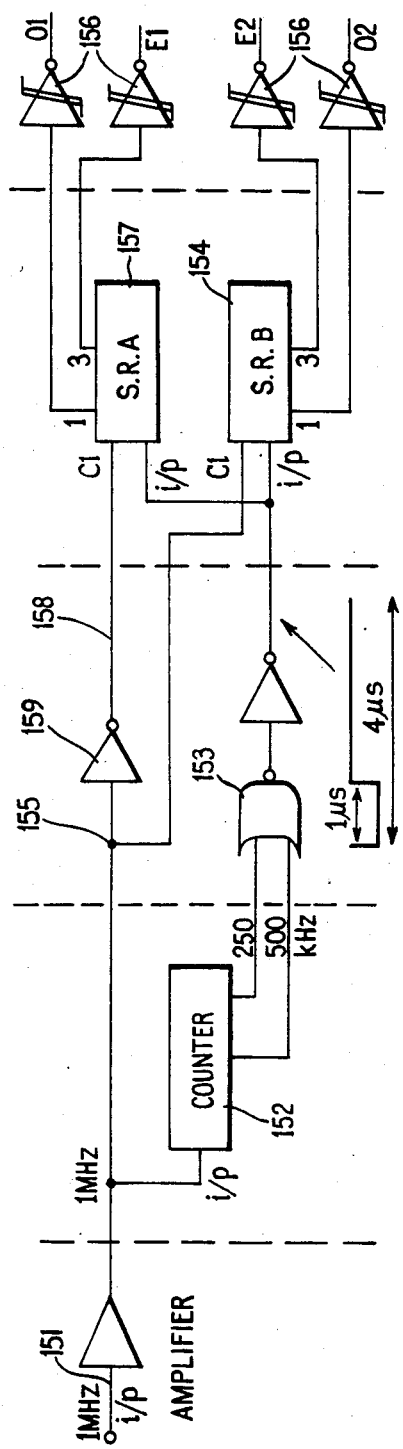
Figure 21:
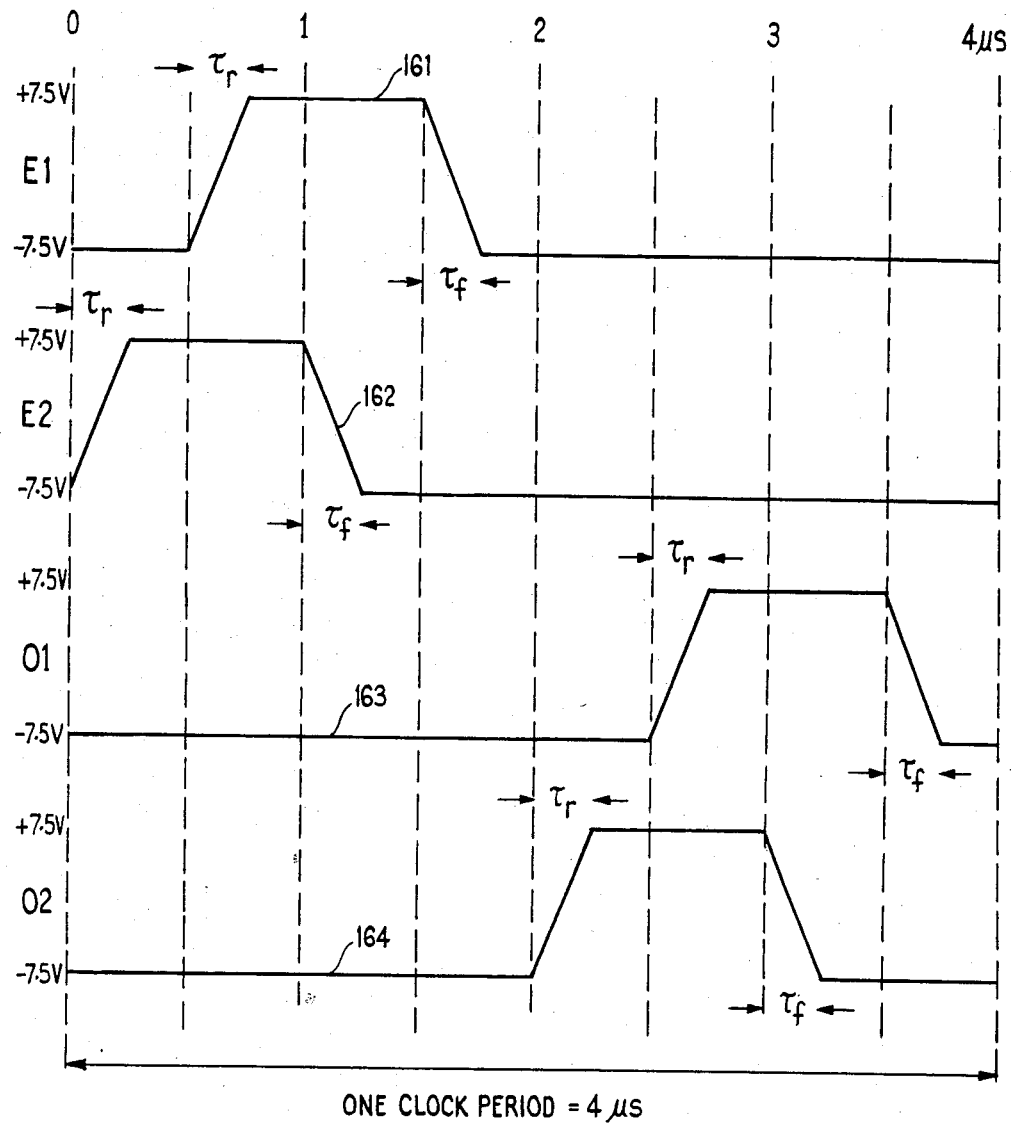

FIG. 11 shows the dependence of low frequency gain on power supply voltage for the optimum 4-phase switching waveform 9a and the conventional 2-phase switching waveform 9e;

FIG. 12 illustrates a 5th order polynominal low pass filter using parasitic insensitive integrators;

FIGS. 13a and 13b show two forms of optimum 4-phase switching waveforms;

FIG. 14 shows a modified form of the optimum 4-phase switching waveforms including additional conditions;

FIG. 15 shows a 2nd order bandpass filter;

FIGS. 16a and 16b show respectively 4-phase and 2-phase switching waveforms applied for comparison to the filter of FIG. 15;

FIG. 17 is a graph comparing the measured and theoretical performances for the filter of FIG. 15 using 4-phase switching;

FIG. 18 is a graph comparing the measured and theoretical performances for the filter of FIG. 15 using 2-phase switching;

FIG. 19 is a block diagram of a filter system incorporating a switched capacitor filter;

FIG. 20 is a schematic diagram of the clock circuit of FIG. 19 for producing 4-phase switching waveforms;

FIG. 21 shows the four waveforms produced by the clock circuit of FIG. 20.

Figure 8:
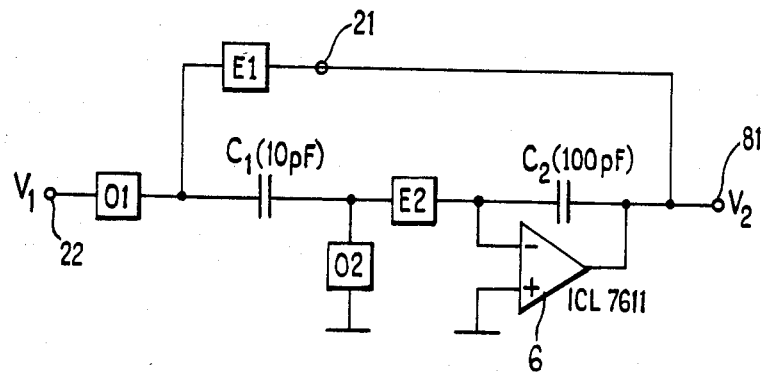
FIG. 8 shows a first order filter employing the differential integrator of FIG. 4.
Figure 22:
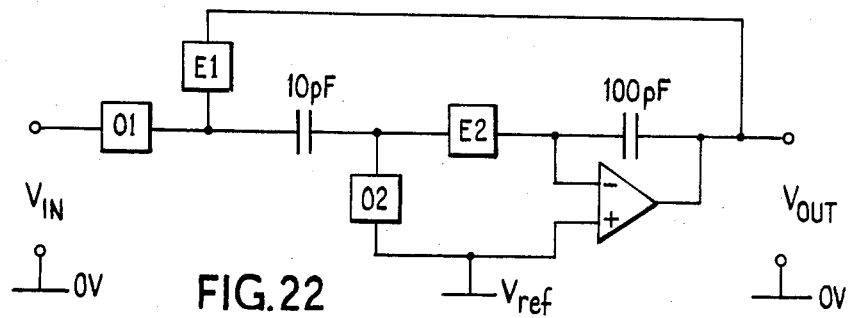
Figure 24:
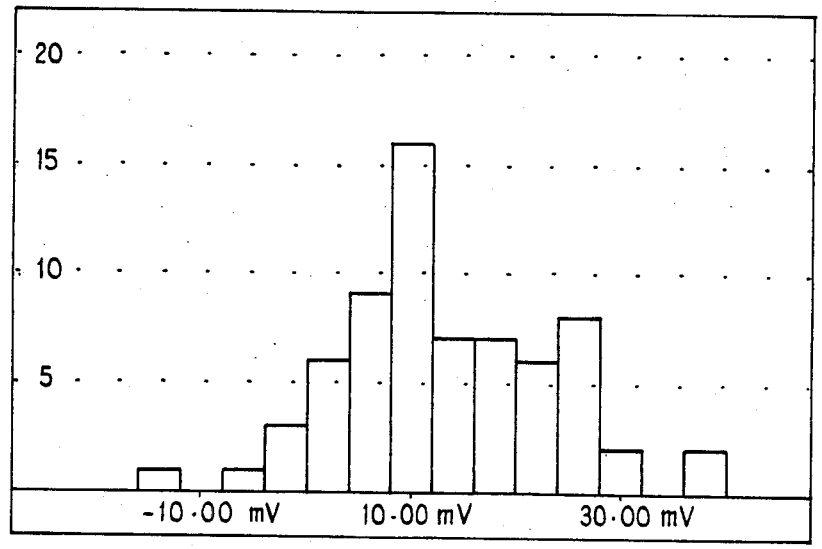
Figure 23:
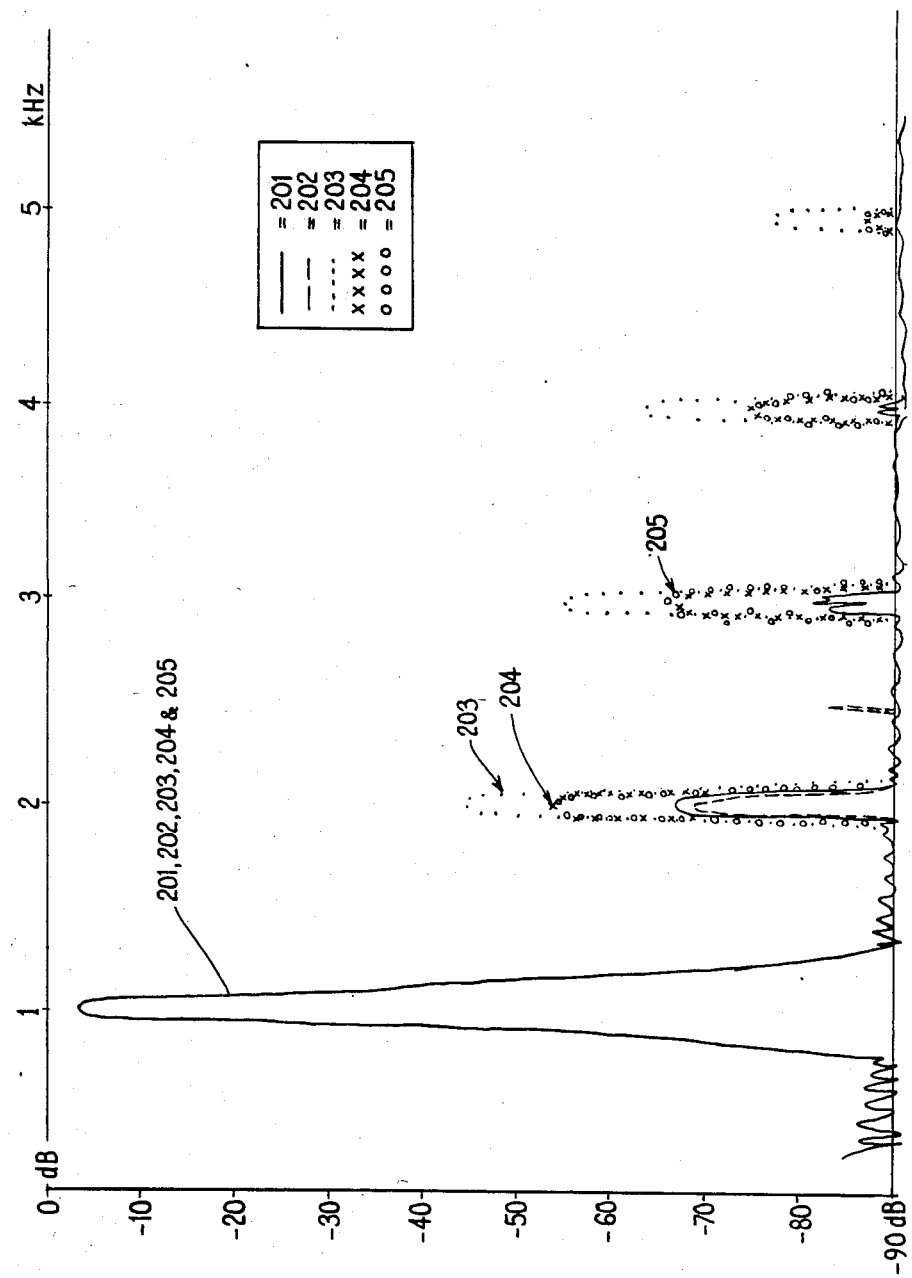
Figure 25:
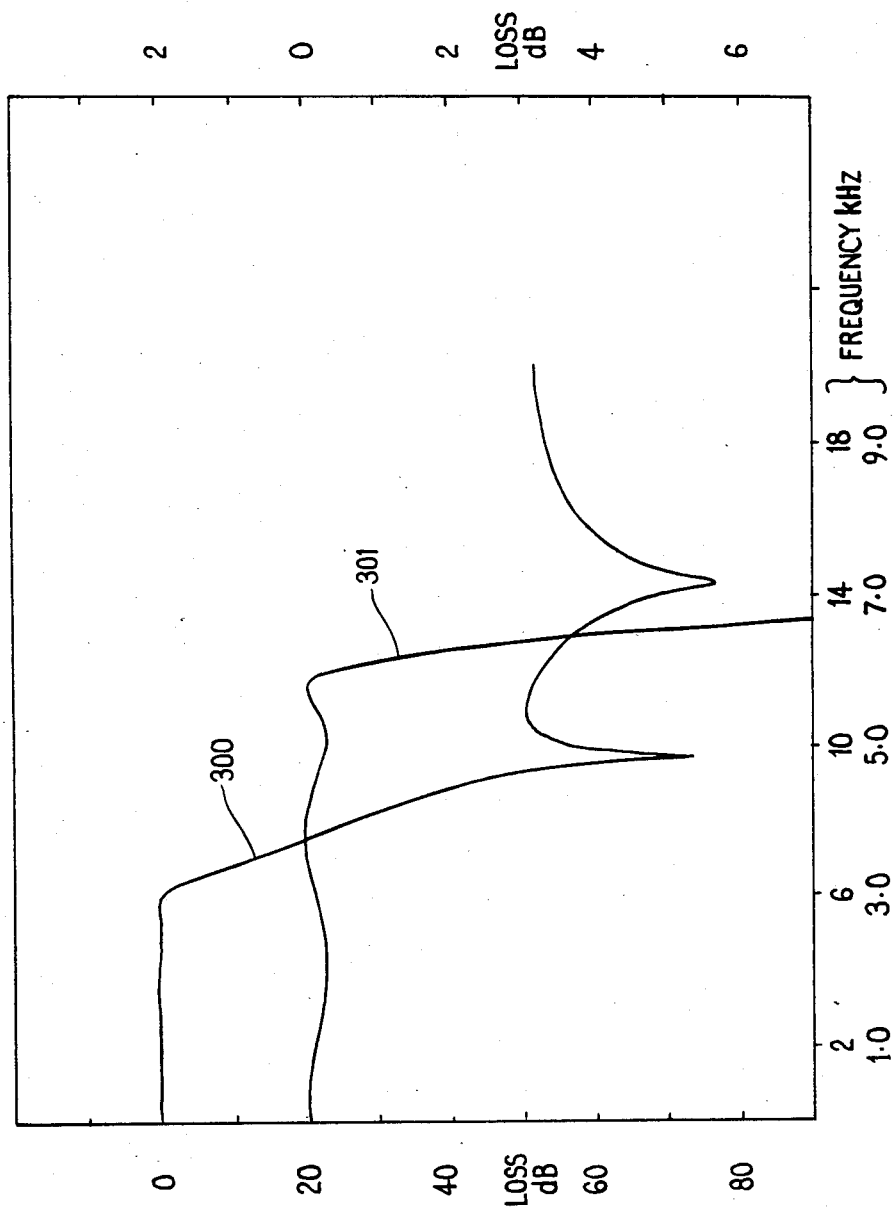

FIG. 22 shows the 1st order low pass filter of FIG. 8 modified for 2-phase switching in accordance with the invention;

FIG. 23 is a graphical superposition of the frequency dependence of the filter response from the filter circuit of FIG. 22 under various 4-phase and 2-phase switching conditions;

FIG. 24 is a histogram showing the distribution of DC offset voltaage for 88 samples of a 5th order elliptic low pass switched capacitor filter fabricated as an integrated circuit in CMOS technology and employing 4-phase switching; and FIG. 25 shows measurements in graphical form of the frequency response of the filter of the integrated circuit switched capacitor filter.

Figure 1:
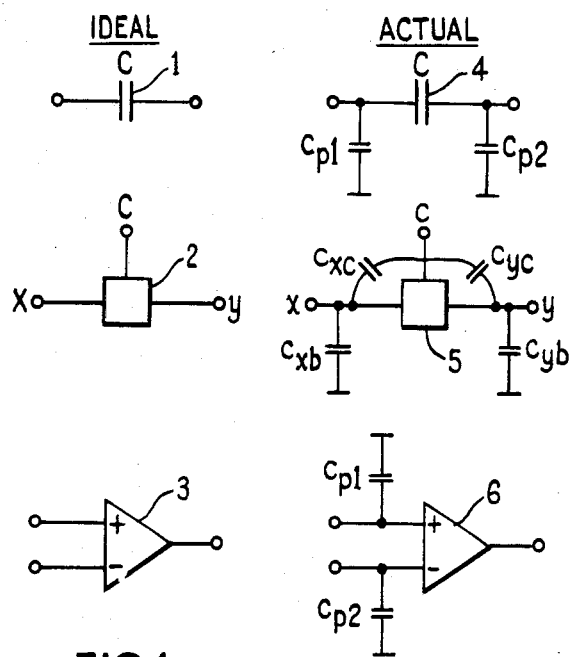
FIG. 1 illustrates ideal elements of a switched capacitor circuit and the actual elements when included in the circuit and including associated parasitic capacitances.

The elements of a switched capacitor circuit are represented in FIG. 1 to show some of the parasitic capacitances which are present in practical realizations of those elements. 1, 2 and 3 respectively represent a capacitor, a switch with its control terminal c and an operational amplifier. When incorporated in practical circuits the ideal elements 1, 2 and 3 are represented by 4, 5 and 6 and each has a grounded parasitic capacitance associated with its terminals while the switch 5 also has parasitic capacitances $C_{xc}$ and $C_{yc}$ between and its control terminal c its input/output terminals x and y. The immunity to the effect of parasitic capacitances obtained by the use of parasitic insensitive circuits extends to all the parasitic capacitances except the capacitances $C_{xc}$ and $C_{yc}$ associated with the control terminal of the switch. The inventors have attempted to analyze the effects of these control terminal parasitic capacitances in the context of parasitic insensitive circuits.

The capacitor 4 has parasitic capacitances $C_{p1}$, $C_{p2}$ from its nodes to ground which can be a significant fraction of its value, depending upon the precise method of fabrication. The parasitic capacitances associated with the switch 5 would typically be of the order of 0.1 pF and the significance of these becomes apparent on realizing that the minimum circuit capacitance will typically be about 0.5 pF. The operational amplifier 6 has parasitic capacitances $C_{p1}$, $C_{p2}$ between each input terminal and ground of about 5 pF and between the two input terminals (not shown) of about 1 pF. The non-inverting input of the differential amplifier is usually grounded and under this condition the differential input capacity between the two input terminals becomes grounded and thus the circuit operation is immune to its effect in parasitic insensitive circuits.

Figure 2:
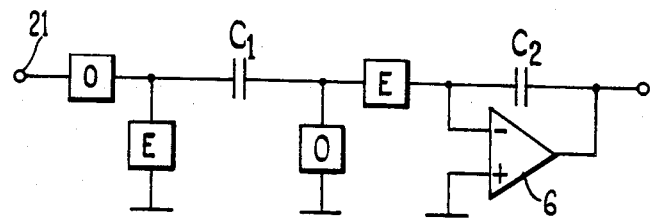
FIGS. 2a–2d illustrate four known forms of parasitic insensitive switched capacitor circuits.
Figure 2:
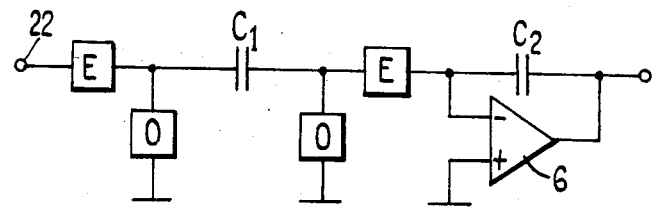
Figure 2:
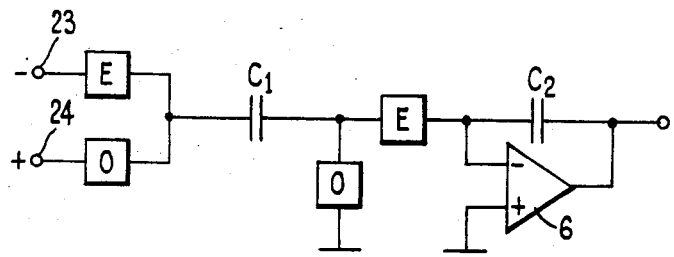
Figure 2:
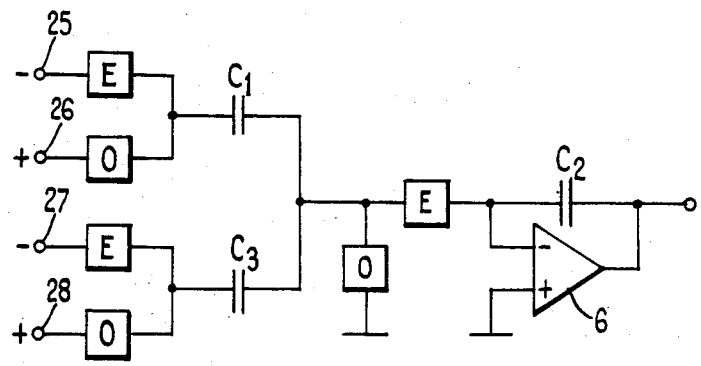
Figure 3:
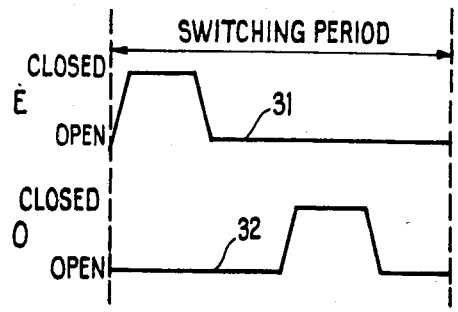
FIG. 3 shows the conventional 2-phase switching waveforms for the even (E) and odd (O) switches.

Four types of known parasitic insensitive integrators are shown in FIG. 2 with the switch control terminals omitted for clarity. The switches labelled E are closed during the even phase of the switching clock cycle and the switches labelled O are closed during the odd clock phases. FIGS. 2a and 2b are circuits proposed by Martin (IEEE vol CAS-27, No 4, pp 237-244, April 1980) with respective non-inverting and inverting input terminals 21 and 22; FIG. 2c is a differential input integrator having an inverting input terminal 23 and a non-inverting input terminal 24 and FIG. 2d is a general multi-input integrator having two inverting input terminals 25, 27 and two non-inverting input terminals 26, 28. All four circuits are usually operated with 2-phase non-overlapping switching signals 31 and 32 for the E and O switches respectively as shown in FIG. 3. For the purpose of analysis of the effect of the parasitic capacitances associated with the switch control terminals (FIG. 1), it was decided to consider the differential amplifier circuit of FIG. 2c because the circuits of FIGS. 2a and 2b can be derived from it by grounding an appropriate one of the input terminals, and the results obtained can be extended to the circuit of FIG. 2d by a form of superposition. Switched capacitor filters are usually operated with continuous-time input signals, in which case the switches connected to the input terminal are effectively sampling the continuous-time input signal. Sampling introduces the problem of aliassing whereby signal frequencies above the Nyquist frequency (Fs/2, where Fs is the switching frequency) suffer a frequency translation down into the Nyquist frequency band. Thus it is usual to attenuate high frequency input signals by means of a continuous-time pre-filter.

Figure 4:
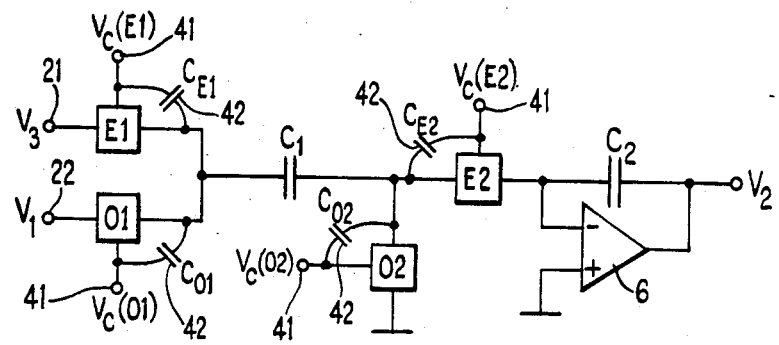
FIG. 4 shows the circuit of FIG. 2c modified to include the switch control terminals and the significant parasitic capacitances associated with these terminals.

The circuit of FIG. 2(c) is shown in FIG. 4 with the E and O switches distinguished by the suffixes 1 and 2 and including the switch control terminals 41 and one parasitic capacitance 42 associated with each switch control terminal 41. The other parasitic capacitance associated with the switch control terminal is omitted because, in the case of switches, E1, O1 and O2, it is connected to a voltage source or ground and therefore has no significant effect; and in the case of switch E2, the other parasitic capacitance causes predominantly an attentuated and inverted replica of the E2 switch control signal $V_c$(E2) to be superimposed on the output voltage. This clock feed-through can contribute DC offset voltage in a filter consisting of an interconnection of integrators but the offset introduced is typically an order of magnitude less than the effects which will be considered here, as can be shown in the case of a simple first order filter as shown in FIG. 8.

Conventionally, the switches E1 and E2 in FIG. 4 would have the same control signal, and similarly for O1 and O2. However, in practice, due to slight differences of timing and device characteristics, nominally identical switches with nominally identical control signals will change state at slightly different instants. Since the effect of the parasitic capacitances is critically dependent on such relative time differences, as we shall see, we consider for the purpose of analysis that the four switches are controlled by four separate switching signals. However, in order that the circuit operates correctly as a 2-phase circuit, it is necessary that the four switch control signals satisfy certain constraints. Here, we assume that the switching period is divided into two parts; in one part switches O1 and O2 are always open and E1 and E2 both close in either order and then both open in either order; in the other part, switches E1 and E2 are always open and O1 and O2 both close in either order and then both open in either order.

For each of the four switches, it is very convenient to define a voltage $V_e$, referred to as the effective transition voltage, which is the difference between the control voltage at which the switch changes state ($V_T$, switch threshold voltage) and the limiting value of the control voltage when the switch is open ($V_{op}$). Thus, for the switch E1:

$$V_e(E1) = V_T(E1) - V_{op}(E1) \qquad (1)$$

Figure 5:
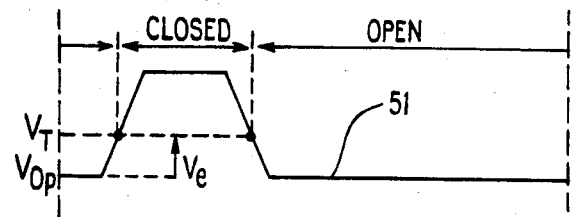
FIG. 5 is a switch control waveform defining the voltages to be used in an analysis of the integrator circuit shown in FIG. 4.

This definition is illustrated by the switch control voltage waveform 51 as shown in FIG. 5. $V_e$(O1), $V_e$(E2) and $V_e$(O2) are defined in a similar way.

Finally, we consider the method of anaylsis. Since the parasitic capacitances cause the output voltage $V_2$ to assume in general a staircase form, it is appropriate to determine the difference between the input voltages $V_1$ and $V_3$, referred to as the input offset-voltage, which causes the output voltage $V_2$ to remain unaltered after one switching cycle and hence to be at equilibrium.

The input offset voltages produced by the four parasitic capacitances are given in Table 1 for different switch timings. It can be seen that irrespective of the order in which the switches open or close, the parasitic capacitance $c_{O2}$ makes the same negative contribution. $c_{E2}$ always makes a positive contribution; if switch $E_2$ closes before switch $E_1$ then the contribution due to $c_{E2}$ has the same form as that due to $c_{O2}$ apart from sign; if switch E2 closes after switch E1, then the form of the contribution due to $c_{E2}$ is different, but becomes the same if $c_{E2} < C_1$, which is generally true. However, the most interesting result is that $c_{O1}$ introduces no contribution if switch O2 opens before switch O1, and similarly $c_{E1}$ introduces no contribution if switch E2 opens before switch E1. Switching waveforms which satisfy both of these conditions and therefore prevent $c_{O1}$ and $c_{E1}$ contributing input offset voltage will be referred to as optimum switching waveforms.

Two assumptions made in this analysis must be discussed. Firstly, we have assumed that the parasitic capacitances are constant, whereas in fact they may be non-linear (voltage dependent). However, since the input offset voltages are introduced when the switch control signals are between $V_T$ and $V_{op}$, we can regard the capacitances in Table 1 as the capacitances of the switches when they are in the open state. The second assumption is that we have analyzed the effect of each capacitance in turn with the other capacitances assumed to be zero. This assumption is justified firstly by the fact that it makes straightforward analysis possible and secondly on the analysis of a first order filter circuit (FIG. 8) where this assumption was avoided has shown that the assumption allows the prediction of first order circuit effects.

switch threshold voltage to its signal voltage, and in order to do this we have to consider the way in which the switch is realized.

The general trend in the realization of switches is to use the CMOS switch consisting of an NMOS FET and PMOS FET, although single P or N MOS FETs are sometimes recommended for switches whose signal voltage is zero. For the CMOS type of switch, the relationship between threshold voltage and signal voltage is non-differentiable and this makes mathematical analysis more difficult than in the case of the single PMOS or NMOS switch. We shall therefore continue our analysis on the basis of single MOSFET switches and consider the CMOS switch in a more empirical fashion later.

For an idealized transistor with zero device threshold voltage, the switch threshold voltage $V_T$ is equal to the switch signal voltage $V_S$,

TABLE 1

Input offset voltages due to parasitic capacitances associated with switch control terminals

| | Close first | Open first | Close first | Open first | Parasitic Capacitance | | | |
|---|---|---|---|---|---|---|---|---|
| | | | | | $c_{01}$ | $c_{02}$ | $c_{E1}$ | $c_{E2}$ |
| (D) | O1 | O1 | E1 | E1 | $\frac{Ve(O1)}{1 + C_1/c_{01}}$ | $\frac{-Ve(O2)c_{02}}{C_1}$ | $\frac{-Ve(E1)}{1 + C_1/c_{E1}}$ | $\frac{Ve(E2)}{1 + C_1/c_{E2}}$ |
| | O1 | O1 | E1 | E2 | " | " | 0 | " |
| | O1 | O1 | E2 | E1 | " | " | $\frac{-Ve(E1)}{1 + C_1/c_{E1}}$ | $\frac{Ve(E2)c_{E2}}{C_1}$ |
| (C) | O1 | O1 | E2 | E2 | " | " | 0 | " |
| | O1 | O2 | E1 | E1 | 0 | " | $\frac{-Ve(E1)}{1 + C_1 c_{E1}}$ | $\frac{Ve(E2)}{1 + C_1/c_{E2}}$ |
| | O1 | O2 | E1 | E2 | 0 | " | 0 | " |
| | O1 | O2 | E2 | E1 | 0 | " | $\frac{-Ve(E1)}{1 + C_1/c_{E1}}$ | $\frac{Ve(E2)c_{E2}}{C_1}$ |
| | O1 | O2 | E2 | E2 | 0 | " | 0 | " |
| | O2 | O1 | E1 | E1 | $\frac{Ve(O1)}{1 + C_1/c_{01}}$ | " | $\frac{-Ve(E1)}{1 + C_1 c_{E1}}$ | $\frac{Ve(E2)}{1 + C_1/c_{E2}}$ |
| | O2 | O1 | E1 | E2 | " | " | 0 | " |
| | O2 | O1 | E2 | E1 | " | " | $\frac{-Ve(E1)}{1 + C_1/c_{E1}}$ | $\frac{Ve(E2)c_{E2}}{C_1}$ |
| | O2 | O1 | E2 | E2 | " | " | 0 | " |
| (B) | O2 | O2 | E1 | E1 | 0 | " | $\frac{-Ve(E1)}{1 + C_1/c_{E1}}$ | $\frac{Ve(E2)}{1 + C_1/c_{E2}}$ |
| | O2 | O2 | E1 | E2 | 0 | " | 0 | " |
| | O2 | O2 | E2 | E1 | 0 | " | $\frac{-Ve(E1)}{1 + C_1/c_{E1}}$ | $\frac{Ve(E2)c_{E2}}{C_1}$ |
| (A) | O2 | O2 | E2 | E2 | 0 | " | 0 | " |

In order to discuss the implications of the results in Table 1, it is necessary to determine the effective transition voltages which appear in Table 1, and this can only be done by considering the way in which the switches are realized.

Realization of switches.

Figure 6:
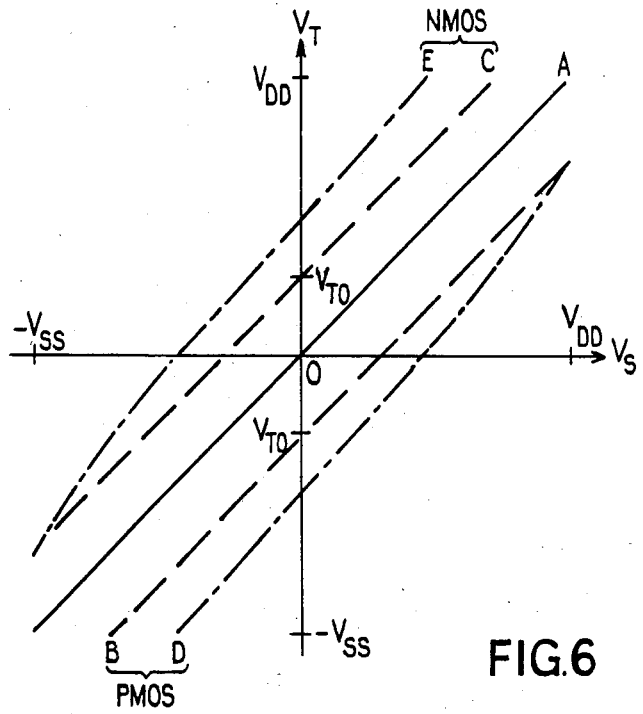
FIG. 6 is a sketch of the relationship between threshold voltage ($V_T$) and signal voltage (Vs) for MOSFET switches.

We begin by defining the signal voltage of a switch as the voltage which its signal terminals assume when the switch is in the closed state. Thus, in FIG. 4 the signal voltages for the switches E1, O1, O2 and E2 are $V_3$, $V_1$, zero and zero, respectively. The next step is to relate the $$V_T = V_S \quad (2)$$

as illustrated by curve A in FIG. 6. For enhancement mode PMOS or NMOS transistors with device threshold voltage $v_{TO}$, but negligible body effect, the relationship between $V_T$ and $V_S$ becomes, $$V_T = V_S + v_{TO} \quad (3)$$

as shown by curves B and C in FIG. 6. In practice, body effect introduces non-linearity into the relationship as illustrated by curves D and E in FIG. 6, and this may be approximated for long channel MOS devices by, $$V_T = V_S + v_{TO} + K[(V_{sub} + \phi)^{\frac{1}{2}} - \phi^{\frac{1}{2}}] \qquad (4)$$

where K is the body factor and $\phi$ is twice the Fermi potential (usually taken as 0.6 V). The parameter $V_{sub}$ is given for PMOS by, $$V_{sub} = V_{DD} - V_S \qquad (5)$$

and for NMOS by $$V_{sub} = V_S - (-V_{SS}) = V_{SS} + V_S \qquad (6)$$

where $V_{DD}$ and $-V_{SS}$ are the positive and negative power supply voltages.

Assuming that $V_{op}$, the limiting value of the control voltage when th switch is open, is $V_{DD}$ for PMOS and $-V_{SS}$ for NMOS, the effective transition voltages defined in Equation (1), are for PMOS, $$V_e = V_T - V_{DD} \qquad (7)$$
$$= -V_{DD} + V_S + v_{TO} + K[(V_{DD} - V_S + \phi)^{\frac{1}{2}} - \phi^{\frac{1}{2}}]$$

and for NMOS $$V_e = V_T - (-V_{SS}) \qquad (8)$$
$$= V_{SS} + V_S + v_{TO} + K[(V_{SS} + V_S + \phi)^{\frac{1}{2}} - \phi^{\frac{1}{2}}]$$

The implications of these relationships are examined by considering them to consist of the sum of three components which can be related to the three performance degradations introduced in an integrator by the parasitic capacitances associated with switch control terminals, these degradations being DC offset voltage, modification of the transfer function and distortion. The first component is independent of $V_S$ and is given by the value of $V_e$ for $V_S = 0$. For PMOS, we obtain from equation (7).

$$V_{e1} = -V_{DD} + v_{TO} + K[(V_{DD} + \phi)^{\frac{1}{2}} - \phi^{\frac{1}{2}}] \qquad (9)$$

The second component is linear in $V_S$. The gradient is given by $dV_e/dV_S$ for $V_S = 0$ and its constant term is zero. For PMOS, we have from equation (7), $$V_{e2} = \left[1 - \frac{K}{2}(V_{DD} + \phi)^{-\frac{1}{2}}\right] V_S \qquad (10)$$

The third and residual component contains the non-linearity and is given for PMOS by, $$V_{e3} = \qquad (11)$$
$$K\left[(V_{DD} - V_S + \phi)^{\frac{1}{2}} + \frac{V_S}{2}(V_{DD} + \phi)^{-\frac{1}{2}} - (V_{DD} + \phi)^{\frac{1}{2}}\right]$$

Figure 7:
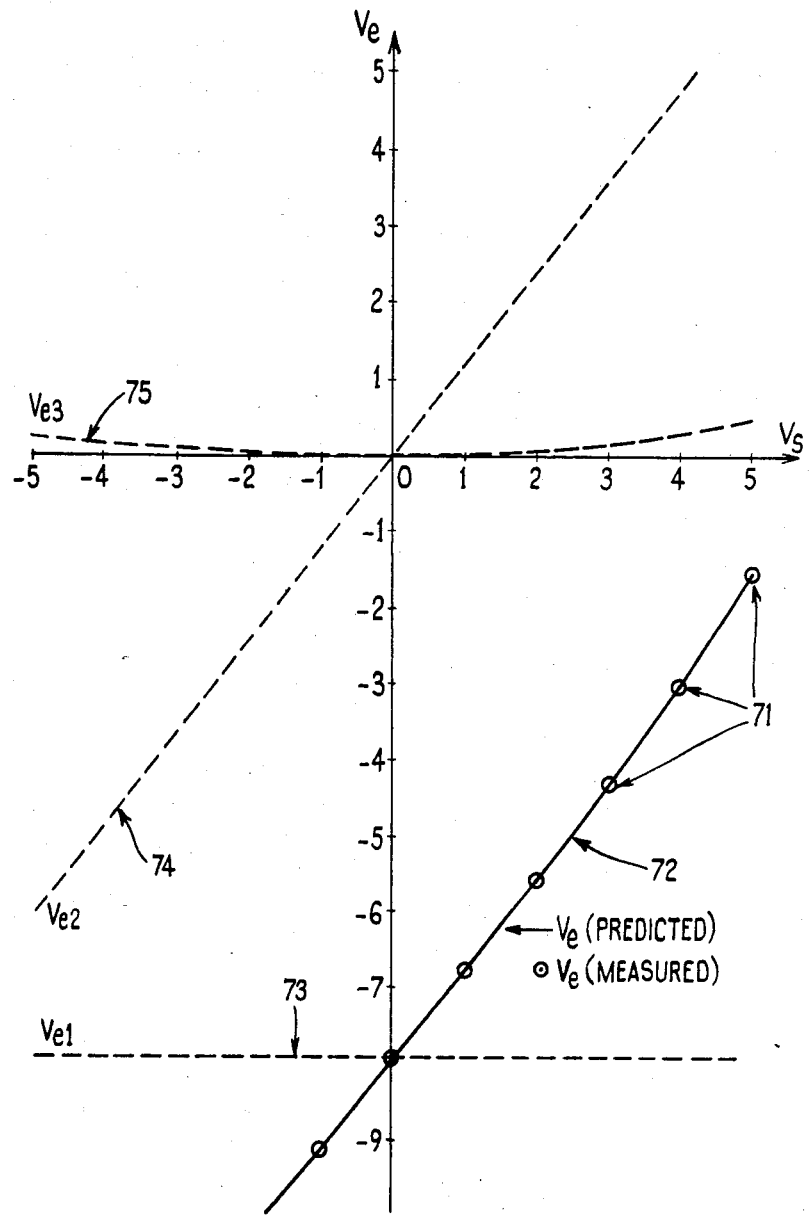
FIG. 7 is a graph showing the relationship between the effective transition voltage (Ve) and the signal voltage ($V_s$) for a PMOS switch.

The measured relationship between effective transition voltage and signal voltage for a typical PMOS transistor on an RCA 3600 integrated transistor array using a positive power supply voltage of 5 V is shown by the plotted points 71 in FIG. 7. The value of the parameters $v_{TO}$ and K in equation (7), obtained from the measured values of $V_e$ for $V_S = V_{DD}$ and $V_S = 0$, respectively, were $V_{TO} = -1.59$ V and $K = -0.848$ $V^{\frac{1}{2}}$. The relationship 72 between $V_e$ and $V_S$ predicted by equation (7) using these parameter values is also shown in FIG. 7, and it can be seen that it fits the experimental data satisfactorily. Finally, FIG. 7 shows the constant (73), linear (74) and non-linear (75) components given by equations (9), (10) and (11), which are, in this example, $$V_{e1} = -7.94 \qquad (12)$$

$$V_{e2} = 1.18 \ V_S \qquad (13)$$

$$V_{e3} = -0.848 \ (5.6 - V_S)^{\frac{1}{2}} + 0.211 \ V_S - 2.37 \qquad (14)$$

where the units of $V_S$, $V_{e1}$, $V_{e2}$ and $V_{e3}$ are volts.

DC offset voltage.

The constant components of the effective transition voltages of the switches correspond to input offset voltages, given by Table 1, which are independent of any signal voltages and are therefore DC offset voltages. If optimum switching waveforms are used, in which switch E2 opens before switch E1 and switch O2 opens before switch O1, then only the parasitic capacitances $C_{E2}$ and $C_{O2}$ introduce DC offset; as mentioned earlier, these contributions are similar apart from sign and they cancel if $C_{E2} = C_{O2}$ and $V_e$ (E2) = $V_e$ (O2). The first condition can be satisfied by the use of matched transistors and routing for the switches E2 and O2. Equation (9) shows that this will also satisfy the second condition because matched transistors would have the same threshold voltage and body factor.

The use of 4-phase switching waveforms, in which switch E2 opens after switch E1 and O2 opens after switch O1, will allow cancellation of the DC offsets due to the parasitic capacitances $C_{E1}$ and $C_{O1}$, but then low DC offset would depend on matching of two pairs of transistors and their routing, whereas with optimum 4-phase switching waveforms it is necessary to match only one pair of transistors and their routing.

A comparison of predicted and measured DC offset voltage will be made for the 1st order filter of FIG. 8 which is obtained from the differential integrator of FIG. 4, by connecting the inverting input terminal 21 to the output terminal 81. The capacitor values and amplifier type are given in FIG. 8. The switches are PMOS and realized in practice using CA 3600 integrated transistor arrays. The five sets (A-E) of switching waveforms shown in FIGS. 9a-9e were considered: A, B, C and D are 4-phase. A being optimum since E2 and O2 open before E1 and O1, respectively (note that for PMOS switches a negative pulse closes the switch); in B, E2 opens after E1 allowing $C_{E1}$ to contribute offset voltage; in C, O2 opens after O1 allowing $C_{O1}$ to contribute offset voltage; in D, E2 opens after E1 and O2 opens after O1 allowing both $C_{E1}$ and $C_{O1}$ to contribute offset voltages; E is 2-phase where E1 and E2, and O1 and O2, are nominally identical. The rows in Table 1 which correspond to the 4-phase switching waveforms A, B, C and D are indicated. By summing the individual offset voltages in Table 1, with the effective transition voltages $V_e$(O1) etc given by equation (12) and assuming a value for the parasitic capacitances $c_{E1}$ etc of 0.75 pF, we obtain the predicted DC offset voltages at the output of the 1st order filter as given in Table 2. Note that the DC offset voltage using 2-phase switching waveforms cannot be predicted as discussed above.

The measured DC offset voltages of the practical circuit are also shown in Table 2. The DC offset voltage of +94 mV using optimum switching waveforms is attributed to sources other than the parasitic capacitances associated with the switch control terminals. With switching waveforms B and C, DC offset voltages of −686 mV and +660 mV are introduced. These introduced DC offset voltages are in reasonable agreement with the predicted values. With switching waveforms D, there is considerable cancellation of the DC offset voltages due to $C_{O1}$ and $C_{E1}$, as expected. The DC offset voltage using 2-phase switching waveforms (E) is of the same order as that using waveforms A and D. This suggests that in this particulr circuit switches E2 and O2 are both opening before or both opening after E1 and O1.

TABLE 2
Predicted and measured DC offset voltage for 1st order filter using PMOS switches

| DC Offset (mV) | Switching Waveforms | | | | |
|---|---|---|---|---|---|
| | A | B | C | D | E |
| Predicted | 0 | −601 | +559 | −42 | ? |
| Measured | +94 | −592 | +754 | +120 | +116 |

TABLE 3
Predicted and measured low frequency gain for 1st order filter using PMOS switches

| Low frequency gain (dB) | Switching Waveforms | | | | |
|---|---|---|---|---|---|
| | A | B | C | D | E |
| Predicted | 0.00 | +0.51 | −0.51 | 0.00 | ? |
| Measured | 0.00 | +0.55 | −0.74 | −0.02 | −0.09 |

TABLE 4
Predicted harmonic distortion for 1st order filter using PMOS switches (switching waveforms C).

| Harmonic | Level (dB) |
|---|---|
| 2nd | −67.9 |
| 3rd | −91.8 |
| 4th | −113.8 |
| 5th | −141.0 |

TABLE 5
Measured harmonic distortion in dB for 1st order filter using PMOS switches

| Harmonic | Switching Waveforms | | | | |
|---|---|---|---|---|---|
| | A | B | C | D | E |
| 2nd | −68 | −42 | −49 | −56 | −44 |
| 3rd | −78 | −53 | −60 | −63 | −58 |
| 4th | −88 | −64 | −71 | −72 | −58 |
| 5th | <−90 | −75 | <−90 | −84 | −67 |

Modification of the transfer function.

The linear components of the effective transition voltages of the switches correspond to input offset voltages, as given by Table 1, which are proportional to the switch signal voltages. For switches E1 and O1, the signal voltages are equal to the integrator input voltages, and therefore the input offset voltages due to the parasitic capacitances $c_{E1}$ and $c_{O1}$ will have components proportional to the integrator input voltages which modify the transfer function of the integrator. For switches E2 and O2, on the other hand, the signal voltages are zero and, consequently, the parasitic capacitances $c_{E2}$ and $c_{O2}$ do not affect the transfer function of the integrator.

It follows that the use of optimum 4-phase switching signals ensures that the transfer function of the integrator is not affected by the parasitic capacitances. Operation of the integrator with 2-phase switching signals will produce the situation where the transfer function is modified in an unpredictable way due to slight differences of individual switch timing as we will now discuss.

With optimum 4-phase switching waveforms the integrator of FIG. 4 realizes the ideal relationship between its port voltages, namely $$V_1 - V_3 = V_2 \frac{C_2}{C_1} (Z^{\frac{1}{2}} - Z^{-\frac{1}{2}}) \tag{15}$$

where $V_1$ is defined in the O phase and $V_2$ and $V_3$ in the E phase. If, on the other hand the switching waveforms are such that switch O2 opens after switch O1, then the input offset voltage due to $c_{O1}$ must be added to the wanted differential input voltage of the integrator as given by equation (15). Taking the input offset voltage due to $c_{O1}$ from Table 1 with $V_e(O1)$ given by equation (10) (assuming PMOS switches) and $V_S$ equal to the switch signal voltage $V_1$, then equation (15) becomes, $$V_1 - V_3 = V_1 \left[ \frac{1 - \frac{K}{2} (V_{DD} + \phi)^{-\frac{1}{2}}}{1 + C_1/c_{O1}} \right] + V_2 \frac{C_2}{C_1} (Z^{\frac{1}{2}} - Z^{-\frac{1}{2}}) \tag{16}$$

If the switching waveforms are such that switch E2 opens after switch E1, then by a similar procedure, we obtain $$V_1 - V_3 = \tag{17}$$

$$-V_3 \left[ \frac{1 - \frac{K}{2} (V_{DD} + \phi)^{-\frac{1}{2}}}{1 + C_1/c_{E1}} \right] + V_2 \frac{C_2}{C_1} (Z^{\frac{1}{2}} - Z^{-\frac{1}{2}})$$

If the switching waveforms are such that switch O2 opens after switch O1 and switch E2 opens after switch E1, then we have, $$V_1 - V_3 = \tag{18}$$

$$\left[ \frac{V_1}{1 + C_1/c_{O1}} - \frac{V_3}{1 + C_1/c_{E1}} \right] \left[ 1 - \frac{K}{2} (V_{DD} + \phi)^{-\frac{1}{2}} \right] +$$

$$V_2 \frac{C_2}{C_1} (Z^{\frac{1}{2}} - Z^{-\frac{1}{2}})$$

The transfer functions in equation (15) corresponding to optimum switching waveforms and equations (16), (17) and (18) corresponding to non-optimum switching waveforms can be represented by the signal flow graphs (SFG's) in FIGS. 10(a)–(d), respectively. With optimum 4-phase switching signals, the ideal SFG in FIG. 10(a) is obtained. The modifications to the SFG's shown in FIGS. 10(b)–(d) cause mainly scaling by a constant of the transfer function of filters realized using the integrator and this manifests itself in the case of lowpass filters as an error in DC gain. Furthermore, these errors in DC gain are functions of the power supply voltage $V_{DD}$, whereas with optimum switching waveforms, the transfer function is independent of the power supply voltage.

Figure 9A:
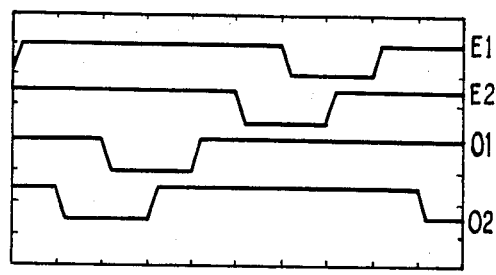
Figure 9A:
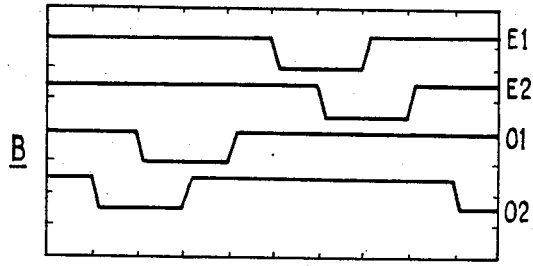
Figure 9A:
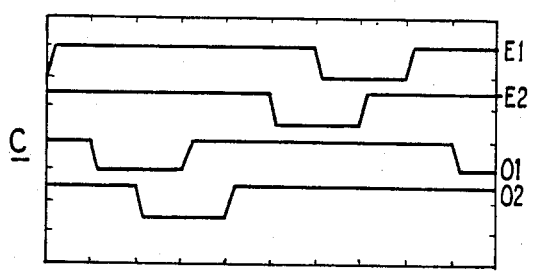
Figure 9A:
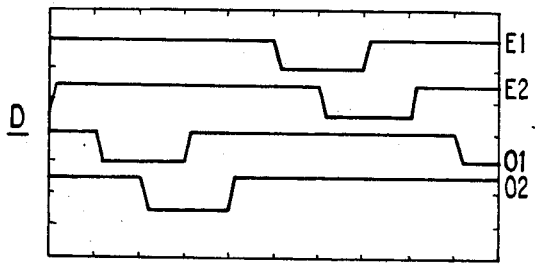
Figure 9A:
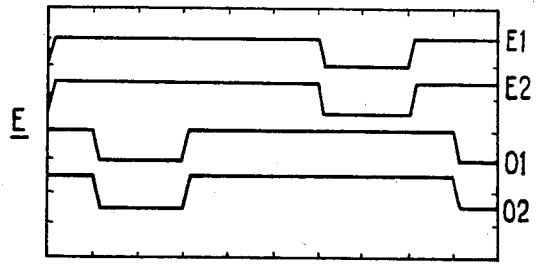
Figure 10:
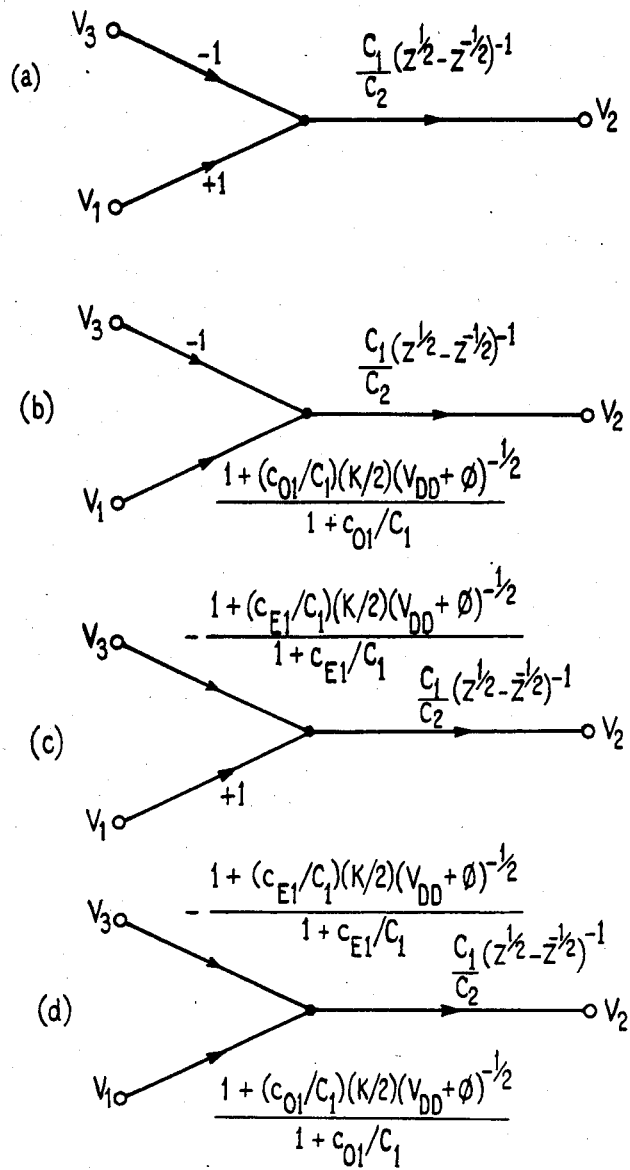
FIGS. 10a–10d show the signal flow graph (SFG) representations of the transfer functions corresponding to the application of the signal waveforms 9a–9d to the differential input integrator of FIG. 4.

The SFG's in FIG. 10 were used to predict the DC gain of the 1st order filter in FIG. 8 for the switching waveforms of FIG. 9, assuming the use of CA 3600 PMOS switches. The predicted DC gains are given in Table 3. Table 3 also shows the measured gain of the practical circuit at a frequency of 60 Hz. Using optimum 4-phase switching waveforms (A), the low frequency gain is very close to its ideal value of zero dB, and it follows that in practice the parasitic capacitances associated with the switch control terminals represent the only major factor causing errors in low frequency gain. It can be seen that with switching waveforms D, there is considerable cancellation of the errors in low frequency gain due to $c_{O1}$ and $c_{E1}$, as predicted. The dependence of the measured low frequency gain on power supply voltage is shown in FIG. 11 for the optimum (A) and 2-phase (E) switching waveforms.

Distortion.

If, for the integrator of FIG. 4, switching waveforms are used which allow the parasitic capacitances $c_{E1}$ and $c_{O1}$ to introduce input offset voltages, then these offset voltages will be non-linear due to the non-linear components of the effective transition voltages of the switches E1 and O1. On the other hand, since for switches E2 and O2 the signal voltages are zero, it follows that the parasitic capacitances $c_{E2}$ and $c_{O2}$ do not introduce non-linear input offset voltages. Thus, the use of optimum 4-phase switching waveforms eliminates distortion due to the parasitic capacitances associated with switch control terminals.

If the optimum switching conditions are violated such that switch O2 opens after switch O1, then there is an input voltage offset due to $c_{O1}$ which is given in Table 1. Substituting for $V_e(O1)$ the nonlinear component of the effective transition voltage for a PMOS transistor (equation (11)) with $V_S$ equal to the signal voltage $V_1$, the non-linear input offset voltage is given by $$v_{01} = \frac{K(V_{DD} + \phi)^{\frac{1}{2}}}{1 + C_1/c_{O1}} \left[ \left(1 - \frac{V_1}{V_{DD} + \phi}\right)^{\frac{1}{2}} + \frac{V_1}{2}(V_{DD} + \phi)^{-1} - 1 \right] \quad (19)$$

Similarly, violation of the optimum switching conditions such that switch E2 opens after switch E1 introduces a non-linear input offset voltage due to $c_{E1}$ given by, $$v_{01} = \frac{-K(V_{DD} + \phi)^{\frac{1}{2}}}{1 + C_1/c_{E1}} \left[ \left(1 - \frac{V_3}{V_{DD} + \phi}\right)^{\frac{1}{2}} + \frac{V_3}{2}(V_{DD} + \phi)^{-1} - 1 \right] \quad (20)$$

The predicted harmonic distortion calculated from equation (19) assuming a sinusoidal input signal of amplitude 1 $V_{rms}$ and CA 3600 PMOS switches is given in Table 4 relative to an input signal amplitude of 0dB. The amplitudes of the harmonics were obtained by expressing the irrational term involving $V_1$ in equation (19) as a power series in $V_1$ and then transforming this series into a Fourier series where each coefficient is itself a series. The predicted distortion due to $c_{O1}$, as given in Table 4, applies when the optimum switching conditions are violated such that switch O2 opens after switch O1, which is the case in switching waveforms C in FIG. 9c.

The measured harmonic distortion of the 1st order filter in FIG. 8 using a sinusoidal input voltage of amplitude 1 V rms and frequency 250 Hz is given in Table 5 for the five types of switching waveforms of FIG. 9. It can be seen that using the optimum switching waveforms (A) the distortion components are very much less than with other switching waveforms.

However, the measured harmonic levels using switching waveforms (C), in which $c_{O1}$ is expected to introduce distortion, are in very poor agreement with the predicted levels in Table 4, being about 20 dB higher. We have to accept therefore that the simple theory and transistor model which we have used are not sufficiently accurate for the prediction of distortion, but note that the optimum switching waveforms, which were proposed on the basis of the simple theory and transistor model, do have the effect of dramatically reducing distortion, in practice as well as in theory.

When 2-phase switching waveforms are used such that switches E1 and E2 are fed with one phase waveform and O1 and O2 are fed with the second phase waveform the effects can be appreciated by considering for the example the use of four identical PMOS transistor switches in the basic integrator circuit of FIG. 4. If the integrator input $V_1$ is positive, then the increase in the threshold voltage of the switch O1 will cause switch O1 to open after switch O2 due to the finite slope time of the switching waveforms and therefore $C_{O1}$(42) produces no input offset voltage. However, for the negative half cycle of the input voltage $V_1$, switch O1 opens before switch O2 and $C_{O1}$ does introduce an input offset voltage, which may be regarded as the sum of a DC offset voltage, a component which modifies the transfer function and a distortion component. Similarly, in negative half cycles of the input voltage $V_3$, $C_{E1}$ will introduce an input offset voltage.

Taking the 1st order circuit (FIG. 8) as an example and applying a continuous time input signal $V_1$, this signal is applied by the O switches to the capacitor $C_1$. In the case of optimum 4-phase switching (FIG. 9a), switch O2 opens before switch O1, and thus the input signal is effectively sampled at the instant when the O2 switch opens. Since the signal voltage for switch O2 is zero its threshold voltage is constant and therefore the input signal is sampled at the same instant in the clock period (uniform sampling). With non-optimum 4-phase switching or 2-phase switching, the sampling instant will depend wholly, or partly, on the instant switch O1 opens. However, the signal voltage for switch O1 is equal to the input voltage $V_1$ and therefore the threshold voltage is signal dependent. This coupled with the finite slope times of the switching waveform will lead to a sampling instant within the switching cycle which is not constant but varies slightly with signal, leading to 2nd order non-linearity, eg distortion. The optimum 4-phase switching scheme eliminates this effect as discussed above.

CMOS switches.

As mentioned earlier, the use of CMOS switches complicates the analysis of the effect of parasitic capacitances because for these switches the threshold voltage is a non-differentiable function of signal voltage. Another complicating factor is that in order to model the parasitic capacitances of a CMOS switch, one requires two control terminals (corresponding to the gates of the NMOS and PMOS FET's) and parasitic capacitances associated with both terminals. In view of the desirability of using CMOS switches, in practice and this difficulty of theoretical modelling and analysis, we shall present some experimental results for filters using CMOS switches. Bur first we shall consider the reasons for using CMOS switches.

The main reason why CMOS switches are desirable in practice is that the signal voltage is limited only by the supply voltages whereas for a single MOSFET switch there is a limit on the signal voltage of the supply voltage minus the device threshold voltage. It is therefore particularly desirable to use CMOS switches for switches E1 and O1 in the integrator of FIG. 4 because for these switches the signal voltages are equal to the integrator input voltages. It is sometimes thought that another reason why CMOS switches are desirable is that there will be cancellation of the effects of the parasitic capacitances associated with the N and P MOSFET's. In fact, this cancellation is difficult to achieve in practice and it is thought that a significant reason for this is as follows: It follows from the above analysis that if the parasitic capacitances of the N and P MOSFET's in a CMOS switch are matched, it is necessary for their effective transition voltages to be equal and of opposite sign in order to achieve cancellation. In practice, the effective transition voltages are unequal because the control voltages on the gates are not the inverses of one another because one is obtained from the other by means of a CMOS inverter and, even if the gate voltages were true inverses, the effective transition voltages would differ by twice the signal voltage. Thus the use of CMOS switches for switches E1 and O1 in the integrator of FIG. 4 does not eliminate the effect of the parasitic capacitances with the consequence of DC offset, modification of the transfer function and distortion. Therefore, use of the optimum 4-phase switching scheme proposed is expected to significantly improve the performance of circuits with CMOS switches.

We now give measured performance parameters for two filters using CMOS switches: the 1st order filter of FIG. 8 and the 5th order polynomial lowpass filter of FIG. 12. In both circuits, switches E1 and O1 are CMOS and switches E2 and O2 are PMOS. The 5th order filter in FIG. 12 was designed to realize a 0.28 dB Chebychev response with a passband edge frequently of 1.5 kHz and a DC gain of zero dB; the minimum capacitance is 5 pF. In both circuits, all the switches were realized using CA 3600 integrated transistor arrays.

The measured performance parameters of the 1 st order filter are given in Table 6. The results are similar to those obtained for the PMOS circuit (Tables 2, 3 and 5) except that the deviations introduced with switching waveforms B and C are less symmetrical and distortion levels are generally worse. The fact that distortion is worse for the circuit with CMOS switches using optimum switching waveforms (A) is surprising because the signal handling capability, as determined by the onset of visible distortion using an oscilloscope, is twice that of the version of the circuit using PMOS switches.

Table 7 shows the measured performance parameters for the 5th order filter. These results are much more difficult to interpret than those for the 1st order filter but clearly show that very large DC offset voltages and errors in low frequency gain, and very severe distortion, can occur using non-optimum switching waveforms.

TABLE 6

Measured performance parameters for 1st order filter using CMOS switches

| Performance parameter | Switching Waveforms | | | | |
| --- | --- | --- | --- | --- | --- |
| | A | B | C | D | E |
| DC Offset (mV) | +83 | −302 | +589 | +100 | +103 |
| Low frequency gain (dB) | 0.00 | −0.72 | +0.43 | +0.04 | −0.04 |
| Harmonic distortion (dB) | | | | | |
| 2nd | −62 | −33 | −25 | −32 | −45 |
| 3rd | −76 | −33 | −42 | −38 | −47 |
| 4th | −75 | −58 | −39 | −39 | −55 |
| 5th | −75 | −43 | −42 | −43 | −54 |
| 6th | −86 | −58 | −86 | −47 | −62 |

TABLE 7

Measured performance parameters for 5th order filter using CMOS switches

| Performance parameter | Switching Waveforms | | | | |
| --- | --- | --- | --- | --- | --- |
| | A | B | C | D | E |
| DC Offset (mV) | +320 | −1922 | +1845 | −829 | +387 |
| Low frequency gain (dB) | +0.01 | +0.05 | −2.80 | −4.88 | +0.19 |
| Harmonic distortion (dB) | | | | | |
| 2nd | −62 | −36 | −14 | −24 | −34 |
| 3rd | −68 | −30 | −26 | −28 | −38 |
| 4th | −73 | −34 | −32 | −30 | −37 |
| 5th | −78 | −48 | −29 | −29 | −46 |

Amplifier settling time.

The design of amplifiers to have sufficiently low settling time is usually a critical aspect of switched capacitor filter design. The time available for the amplifiers to settle depends on certain characteristics of the switching waveforms, and in this section we present two alternative sets of 4-phase switching waveforms which allow maximum amplifier settling time and at the same time satisfy the optimum conditions that reduce DC offset, modification of the transfer function and distortion.

For 4-phase switching waveforms of the type under discussion, it is convenient to define a parameter overlap time as the time during a switching period when the two switches E1 and E2 (or O1 and O2) are both closed. It is a very important parameter because it is the time available within which the amplifier must reach equilibrium (ie settle) if the circuit is to operate correctly. We therefore require switching waveforms with the maximum possible overlap time.

The primary constraints on the switching waveforms which reduce performance degradation are that switch E2 should open before switch E1 and switch O2 should open before switch O1. The secondary constraint, that switch E2 should close before switch E1 which allows exact cancellation of the input offset voltages due to $c_{E2}$ and $c_{O2}$ assuming switches E2 and O2 and their routing are matched, is not considered essential because even if it is not satisfied, cancellation of the input offset voltages will still take place if $c_{E2} < C_1$, as mentioned. This condition is likely to be satisfied in practice.

A necessary condition for correct operation of the integrator circuit is that switches E1 and O1 should never be in the closed state simultaneously; similarly switches E2 and O2 must never be closed simultaneously. Therfore we must leave guard intervals in the switch waveforms to prevent these situations occurring.

We take into account that the switching waveforms are derived from a higher frequency clock signal using frequency division. Thus, the switching period T is divided into an integer number N of time intervals which define instants at which switch waveform transition may occur.

The two possible sets of 4-phase switching waveforms which have maximum overlap time subject to the above constraints are shown in FIGS. 13(a) and (b). It can be seen that the overlap times are given by, $$t_4 = T\tfrac{1}{2} - 2/N \qquad (21)$$

For 2-phase switching wavform, as shown in FIG. 3, the need to leave a guard interval between the times when the E and O switches are closed leads to an overlap time of, $$t_2 = T\tfrac{1}{2} - 1/N \qquad (22)$$

Thus the adoption of 4-phase switching waveforms does reduce the overlap time and therefore imposes a more severe constraint on amplifier settling time.

Further separate improvements in linearity of circuits according to the invention have been shown to occur if the switching waveforms also satisfy the conditions that E1 closes before E2 closes, and O1 switches closed before O2 switches closed.

Referring again, by way of example, to the 1st order low pass filter (FIG. 8), the output voltage $V_2$ is incremented at the point in the switching cycle when switches E1 and E2 have both just closed. Bearing in mind the signal voltages of the switches E1 and E2 are $V_2$ and zero, respectively, we see that if E1 closes before E2, then the output voltage will be incremented at the instant switch E2 closes, and therefore the output voltage will be incremented at a fixed instant in the switching cycle (uniform incrementing). On the other hand, if E2 closes before E1, the instant of incrementing within the switching cycle will depend on the time E1 closes and will be therefore signal dependent, leading to 2nd order non-linear effects. This leads to the constraint for ultra linear operation that E1 should close before E2.

Experimental results, to be given, show that substantial improvements in distortion are obtained if, in addition, O1 closes before O2. The reason for this is not fully understood but the following observation can be made: when both O switches are closed the capacotor $C_1$ is connected to the input voltage source $V_1$. If switch O1 closes before O2 then the instant of connection is defined by the closing of O2 and therefore occurs at a fixed instant in the switch period. Thus with a scheme where O1 closes before O2 and O1 opens after O2, the instant of sampling the input voltage (O2 opening) occurs at a fixed interval after O1 is connected to the input voltage (O2 closing). This could well minimize 2nd order non-linear effects due to any ringing of the input voltage source.

In general, an increase of slope-time of the switching waveform is expected to reduce non-linearity because the switching operation occurs in a more gradual and predictable fashion. The switch waveform constraints: E1 closes before E2 and O1 closes before O2, which eliminate sampling instant errors due to finite slope time are expected to allow the maximum possible slope-time resulting in ultra-linear operation.

The switching waveforms with these further constraints are shown in FIG. 14. With these additional restraints the maximum amplifier settling time is reduced to $T(\tfrac{1}{2} - 3/N)$.

FIG. 15 illustrates a second order discrete component band-pass filter and a 250 kHz 4-phase and a 250 kHz 2-phase switching waveform (FIGS. 16a, 16b) respectively applied to it to illustrate the improved accuracy of the band-pass response when 4-phase switching is used (FIG. 17) rather than the conventional 2-phase switching (FIG. 18). In FIGS. 17 and 18 the curves are the measured responses and the circles are the computed responses.

Conclusions.

Thus adapting 2-phase parasitic insensitive switched capacitor circuits for operation with the described 4-phase switching waveforms in theory eliminates, and in practice significantly reduces, the DC offset voltage, modification of the transfer function and distortion contributed by the parasitic capacitances associated with the switch control terminals.

FIG. 19 is a schematic block diagram of a switched capacitor filter included within a practical filter system. A 1 MHz output from a crystal controlled oscillator is provided at an input 141 to a clock circuit 142 where by using frequency division the four phase waveforms 143–146 for the switches E1, E2, O1 and O2 are produced and connected to the switched capacitor filter 147. Switched capacitor filters are usually operated with continuous-time input signals, in which case the switches connected to the input terminal are effectively sampling the continuous-time input signal. Sampling introduces the problem of aliassing whereby signal frequencies above the Nyquist frequency (Fs/2, where Fs is the switching frequency) suffer a frequency translation down into the Nyquist frequency band. Thus it is usual to attenuate high frequency input signals by means of a continuous-time pre-filter. Signals to be filtered are connected first to an LP anti-aliassing pre-filter 148. The output from the switched capacitor filter 147 is smoothed by an LP post-filter 149 which is also a continuous-time filter. The functional diagram for the clock circuit 142 for producing one arrangement of optimum 4-phase waveforms is shown in FIG. 20. The 1 MHz input signal 151 is first amplified to CMOS levels and then triggers a binary counter 152. A 250 kHz and a 500 kHz outputs from the counter 152 are combined in a NOR gate 153 to produce a pulse which when inverted gives a negative 1 μs pulse with a period of 4 μs. This basic pulse is fed into a shift register 154 which is clocked by the 1 MHz signal 155. The switch waveform for O2 is obtained from tap 1 of the shift register 154 via an inverting Schmitt trigger 156 and for E2 is obtained from tap 3, also via an inverting Schmitt trigger 156 and thus E2 is consequently delayed by 2 μs with respect to O2. The O1 and E1 waveforms are similarly produced trom taps 1 and 3 of a second shift register 157 but these are respectively delayed by 0.5 μs relative to the O2 and E2 waveforms since the second shift register 157 is clocked by the 1 MHz signal 158 obtained by passing the clocking signal 155 through an inverter 159. This produces the 4-phase clock waveforms E1, E2, O1 and O2 as represented by 161–164 in FIG. 21.

Having thus improved the performance of the basic switched capacitor integrator by adopting the 4-phase switch waveforms, these integrators may be incorporated into high order filters designed by conventional methods and the 4-phase switch waveforms used to improve the overall filter performance.

The invention, thus far described with reference to 4-phase switching using four separate switching waveforms, can also be adapted to 2-phase switching, thereby allowing the use of a simpler clocking arrangement. This is achieved by providing a suitable reference voltage level for connection to the basic 4-switch integrator circuit so as to modify the timing of two of the switches compared to the other two when the 2-phase switching waveforms are applied. FIG. 22 illustrates a first order low pass filter circuit, identical to the FIG. 8 circuit except that the O2 switch and the non-inverting terminal of the operational amplifier 6 are connected to a reference voltage level $V_{ref}$ rather than to ground. As in the FIG. 8 arrangement the four switches are identical PMOS switches and each has a rise time of 500 n S. A test signal $V_{in}$ of 1 $V_{rms}$ at 1 kHz is connected to the input of the circuit and the output response V out is measured using conventional 2-phase switching (FIG. 9e), optimum 4-phase switching (FIG. 9a) and non-optimum 4-phase switching (FIG. 9d). FIG. 23 illustrates the output curves:

(a) 201 for optimum 4-phase switching, $V_{ref}=0$;
(b) 202 for 2-phase switching, $V_{ref}=-2$ V;
(c) 203 for 2-phase switching, $V_{ref}=0$ V;
(d) 204 for 2-phase switching, $V_{ref}=+2$ V; and
(e) 205 for non-optimum 4-phase switching, $V_{ref}=0$.

From these results, and according to theory, with $V_{ref} \leq -V$ (where $V_{in}=V \sin w_o t$) 2-phase switching gives similar results to the optimum 4-phase switching, and with $V_{ref} \geq +V$ the results correspond generally to the non-optimum 4-phase switching. These results are tabulated in Table 8, giving the 2nd to the 5th harmonic component measurements in dB. Table 9 gives the results of low frequency gain tests for $V_{in}=100$ mV$_{rms}$ at 6 Hz which shows that the 2-phase switching waveform for $V_{ref}<-1.5$ V is similar to the optimum 4-phase switching. An alternative arrangement of the foregoing method of adapting the invention for 2-phase operation would be to use switches with differing switching characteristics so as to achieve the effects of 4-phase switching.

distribution of DC offset voltage for eighty-eight samples is shown in FIG. 24. This shows a nominal DC offset voltage of 10 mV with an upper limit of about 30 mV and a lower limit of about −10 mV. The measured transfer function is shown by the curves 300 and 301 in FIG. 25 with the stop-band response being illustrated by the curve 300 and the pass-band response by the expanded curve 301. The average value of total harmonic distortion has been measured as −63.36 dB for 70 samples and the average value of total intermodulation distortion as −65.60 dB for 14 samples. Thus the invention which has been shown to be effective for discrete component circuits and theoretically justified, has also been shown to work well when applied to integrated circuit technology.

We claim:

1. A switched capacitor parasitic insensitive integrator having at least one pair of input terminals and an output terminal and comprising:
   amplifier having an input and an output terminal, the amplifier output terminal being connected to the integrator output terminal;
   a first set of even and odd switches, E2 and O2, connected respectively in series between the amplifier input terminal and a reference voltage level;
   an integrating capacitor connected between the amplifier input terminal and the amplifier output terminal;
   at least one second set of even and odd switches, E1 and O1, connected in series between respective terminals of said at least one pair of input terminals of the integrator;
   at least one switched capacitor connected between the interconnection point of said E2 and O2 switches and the respective interconnection point of said E1 and O1 switches; and
   clock means for producing four periodic switching signals, with each signal having the same periodicity and a respective switching signal being connected to each of the four switches, E2, O2, E1 and O1, and for outputting said periodic switching signals such that E2 opens before E1, O2 opens before O1, E1 is not closed when O1 is closed and E2 is not closed when O2 is closed.

2. A switched capacitor integrator according to claim

TABLE 8

| Switching | Opt 4-phase | 2-phase | | | | | | | | | Non-opt 4-phase |
|---|---|---|---|---|---|---|---|---|---|---|---|
| $V_{ref}$ | 0 V | −2 V | −1.5 V | −1 V | −0.5 V | 0 V | +0.5 V | +1 V | +1.5 V | +2 V | 0 V |
| 2nd | −68 | −72 | −54 | −47 | −44 | −44 | −47 | −54 | −53 | −53 | −52 |
| 3rd | −76 | −80 | −63 | −57 | −57 | −52 | −48 | −52 | −61 | −62 | −61 |
| 4th | −86 | −90 | −73 | −68 | −58 | −56 | −73 | −62 | −70 | −67 | −68 |
| 5th | <−90 | <−90 | −86 | −69 | −64 | −72 | −65 | −70 | −72 | −80 | −81 |

TABLE 9

| Switching | $V_{ref}$ | Gain (dB) |
|---|---|---|
| 2-phase | 0 V | −0.09 |
| | −0.5 V | −0.10 |
| | −1 V | −0.05 |
| | −1.5 V | −0.02 |
| | −2 V | −0.02 |
| Optimum 4-phase | 0 V | 0.00 |

A number of integrated circuit samples of a 5th order elliptic low pass switched capacitor filter have been fabricated by Plessey in CMOS technology using optimum 4-phase switching (FIG. 9a). A histogram of the 1 characterized in that the clock means produces 4-phase switching signals and the reference voltage is ground.

3. A switched capacitor integrator according to claim 1 characterized in that the clock means produces first and second phase switching signals having the first phase switching signal being connected to the E switches and the second phase switching signal being connected to the O switches, the reference voltage being selected relative to ground such that the switching times of E2 and O2 differ respectively from E1 and O1.

4. A switched capacitor integrator according to claim 1 characterized in that the clock means produces first and second phase switching signals having the first phase switching signal being connected to the E switches and the second phase switching signal being connected to the O switches, the reference voltage level being ground and the switches made such that the switching times of E2 and O2 differ respectively from E1 and O1.

5. A switched capacitor integrator according to claim 1, said clock means producing the four periodic switching signals such that E1 closes before E2 closes.

6. A switched capacitor integrator according to claim 5, said clock means producing the four periodic switching signals such that O1 closes before O2 closes.

7. A switched capacitor integrator according to claim 2 said clock means comprising:

a signal generator for producing a reference frequency, a multi-stage counter having an input to which the reference frequency is connected, a combining circuit having inputs from two separate stages of the counter to produce a standard switching waveform with a selected mark to space ratio, first and second shift registers having inputs connected to the output of the combining circuit, the shift registers having two outputs from separate stages thereof such that the second outputs provide the switching signals for the E switches delayed relative to the switching signals for the O switches provided by the first outputs, the first shift register being clocked by the positive phase of the reference frequency and the second shift register being clocked by the negative phase of the reference frequency whereby the first shift register provides the E2 and the O2 switching signals and the second shift register provides the E1 and the O1 switching signals with E1 and O1 delayed respectively relative to E2 and O2.

* * * * *